(12) United States Patent
Terai et al.

(10) Patent No.: US 8,148,757 B2
(45) Date of Patent: Apr. 3, 2012

(54) SEMICONDUCTOR DEVICE, AND ITS MANUFACTURING METHOD

(75) Inventors: Masayuki Terai, Tokyo (JP); Shinji Fujieda, Tokyo (JP); Akio Toda, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 253 days.

(21) Appl. No.: 12/447,113

(22) PCT Filed: Oct. 23, 2007

(86) PCT No.: PCT/JP2007/070666
§ 371 (c)(1),
(2), (4) Date: May 20, 2009

(87) PCT Pub. No.: WO2008/050775
PCT Pub. Date: May 2, 2008

(65) Prior Publication Data
US 2010/0090257 A1 Apr. 15, 2010

(30) Foreign Application Priority Data
Oct. 25, 2006 (JP) .................................. 2006-289457

(51) Int. Cl.
*H01L 29/04* (2006.01)
*H01L 29/92* (2006.01)
(52) U.S. Cl. ............... 257/255; 257/314; 257/E29.004; 257/E29.309; 257/E21.423; 438/301
(58) Field of Classification Search .................. 257/255, 257/314, E21.423, E29.004, E29.309
See application file for complete search history.

(56) References Cited

U.S. PATENT DOCUMENTS
2003/0067030 A1* 4/2003 Torii .............................. 257/315

FOREIGN PATENT DOCUMENTS
JP 2001156188 A 6/2001
JP 2003332469 A 11/2003

OTHER PUBLICATIONS

International Search Report for PCT/JP2007/070666 mailed Jan. 15, 2008.
B. Choi et al., "Highly Scalable and Reliable 2-bit/cell SONOS Memory Transistor 50nm NVM Technology Using Outer Sidewall Spacer Scheme with Damascene Gate Process", 2005 Symposium on VLSI Technology Digest of Technical Papers, p. 118-119.

* cited by examiner

*Primary Examiner* — N. Drew Richards
*Assistant Examiner* — Mamadou Diallo
(74) *Attorney, Agent, or Firm* — Sughrue Mion, PLLC

(57) ABSTRACT

A channel is formed at a recessed portion or a projecting portion of a substrate, and a gate insulating film is formed so as to have first to third insulating regions along the channel. Each of the gate insulating films of the first and third insulating regions has a first gate insulating film containing no electric charge trap formed on a plane different from a principal surface of the substrate, an electric charge accumulating film containing an electric charge trap, and a second gate insulating film containing no electric charge trap. The gate insulating film of the second insulating region at the middle is formed on a plane parallel to the principal surface of the substrate and is composed of only a third gate insulating film containing no electric charge trap.

15 Claims, 22 Drawing Sheets

SEMICONDUCTOR DEVICE, AND ITS MANUFACTURING METHOD

This application is the National Phase of PCT/JP2007/070666, filed Oct. 23, 2007, which is based upon and claims priority from Japanese Patent Application No. 2006-289457 filed on Oct. 25, 2006, and the disclosure thereof is expressly incorporated herein in its entirety.

TECHNICAL FIELD

The present invention relates to a semiconductor device and a method thereof and, in particular, to a semiconductor device containing a rewritable non-volatile semiconductor memory called a trap type memory and to a manufacturing method thereof.

BACKGROUND ART

Recently, a trap type memory utilizing trap in insulating films instead of Floating Gate (FG) as electric charge accumulating layers of a FLASH memory draws attention.

FIG. 14 shows a plan view of a relevant trap type memory. As shown in FIG. 14, in the trap type memory, isolation regions 9 are disposed in predetermined regions of a semiconductor substrate so as to restrict active regions including source/drain regions 5. A plurality of gate electrodes 1 cross the active regions, and an electric charge accumulating film 7 is interposed between the gate electrode 1 and the active regions. In addition, the gate electrodes 1 are provided with gate sidewalls 2 and sidewalls 3. FIG. 15A is a cross sectional view taken along the line I-I' shown in FIG. 14, and FIG. 15B is a cross sectional view taken along the line shown in FIG. 14. A first gate insulating film 6, the electric charge accumulating film 7, a second gate insulating film 8, the gate electrodes 1, the gate sidewalls 2, the sidewalls 3, and the source/drain regions 5 are formed on a silicon substrate 10 having the isolation regions 9. Herein, when the locality of accumulated electric charge is utilized, the regions of the electric charge accumulating film which are close to the source or the drain serve as memory nodes 11 and 12, respectively, and the write state of two bits can be realized per one cell. Therefore, the effective cell area per one bit can be reduced.

A general operation method of the trap type memory will be explained. In writing of electric charge, a positive voltage is applied to the gate electrode 1 and either one of the source/drain regions 5, thereby generating channel hot electrons and accumulating electrons in the electric charge accumulating film in the vicinity of an end of the drain. Erasing is carried out by applying a negative voltage to the gate electrode 1, applying a positive voltage to the erasing side of the source/drain regions 5, and injecting hot holes generated by interband tunneling to the electric charge accumulating layer. Reading of the write state is carried out by switching the source and the drain used in writing, and the write state is determined when the amount of the current that flows to the drain is equal to or less than a certain predetermined value when a positive voltage is applied to the gate electrode 1.

However, a first problematic point of the structure shown in FIG. 14 is that, since the two memory nodes 11 and 12 are connected to each other by the electric charge accumulating film 7 above a channel region, the accumulated electric charge of one of the memory nodes diffuses to the other node as writing/erasing of electric charge is repeated, thereby deteriorating rewriting endurance. In this case, stored information is changed, which causes an error, and the retention characteristic of written electric charge is also deteriorated. In addition, the electric charge that diffused to the vicinity of the center of the gate electrode cannot be erased, and erasure VT (threshold voltage) is increased.

Furthermore, after the 90 nm technology node, the retention characteristic of written electric charge cannot be ensured due to leakage of the accumulated electric charge; for this reason, it is difficult to thin the electric charge accumulating layer (the first gate insulating film 6, the electric charge accumulating film 7, and the second gate insulating film 8). More specifically, a second problematic point of the structure shown in FIG. 14 is that, since the electric charge accumulating layer cannot be thinned even when the gate length is shortened along with reduction of the cell area, short-channel characteristics cannot be maintained, and increase of the punch-through current and reduction of the ON/OFF ratio of a read current readily occur.

Mainly against the first problematic point, the cell structure shown in FIG. 16, in which two memory nodes are completely separated from each other, has been reported (see Non-Patent Literature 1). In this memory cell, the gate electrode 1 is formed on a third gate insulating film 13, which does not have the electric charge trap, the gate electrode 1 and the gate sidewalls 2 are sandwiched by second gate electrodes 14 formed on an electric charge accumulating gate insulating film comprising the first gate insulating film 6, the electric charge accumulating film 7, and the second gate insulating film 8, and these three gate electrodes are connected each other by a metal layer 15. The source/drain regions 5 are formed so as to sandwich the three gate electrodes. When this cell structure is used, the outflow of the accumulated electric charge of one of the memory nodes to the other one is eliminated since the memory nodes 11 and 12 are divided by the insulating film not containing the electric charge accumulating film.

Moreover, against the second problematic point, the cell structure shown in FIG. 17 in which a recessed portion is formed on a semiconductor substrate, and a channel is formed along sidewalls of the recessed portion has been proposed (for example, see Patent Literature 1). As shown in FIG. 17, the recessed portion is formed on the silicon substrate 10, and the source/drain regions 5 are formed at an upper portion and a bottom portion of the recessed portion. Furthermore, along the inner surface of the recessed portion, the first gate insulating film 6, the electric charge accumulating film 7, the second gate insulating film 8, and the gate electrode 1 are formed. In this structure, when the depth of the recessed portion is increased, the gate length can be increased effectively, the punch-through current and the read current can be suppressed, and the ON/OFF ratio can be improved.

Non-Patent Literature 1: 2005 Symposium on VLSI Technology Digest of Technical Paper, pp. 118-119

Patent Literature 1: Unexamined Japanese Patent Application KOKAI Publication No. 2003-332469

DISCLOSURE OF INVENTION

However, in the cell structure of Non-Patent Literature 1 shown in FIG. 16, since the gap corresponding to the thickness of the gate sidewall 2 is formed between the gate electrode 1 and the second gate electrode 14, the electric fields from the gate electrode 1 and the second gate electrode 14 are weakened, thereby forming a barrier of channel potentials and reducing the read current.

Moreover, in the structure of Patent Literature 1 shown in FIG. 17, since the memory nodes are connected to each other, the diffusion of accumulated electric charge occurs, and the rewriting endurance and the retention characteristic are deteriorated. Moreover, when the source and the drain in the upper and lower sides of the recessed portion are switched, different electric characteristics are obtained since the source/drain regions 5 are separated to the upper and lower sides of the recessed portion and are asymmetric, and ideal 2-bit/cell operations cannot be obtained.

It is an object of the present invention to solve the problematic points of above described related techniques, and it is an object thereof to provide a trap type non-volatile semiconductor memory device which is excellent in the rewriting endurance and the retention characteristic and having a large ON/OFF ratio of the read current and to provide a manufacturing method thereof.

A semiconductor device according to the present invention is characterized by having a base substrate comprising a semiconductor layer at least by a surface of the base substrate; a channel region formed in the semiconductor layer; first and second diffusion layers formed in the semiconductor layer so as to sandwich the channel region; an insulating film formed on the base substrate so as to cover the channel region; and a gate electrode formed on the base substrate via the insulating film; wherein the insulating film contains a structure in which a first insulating region containing an electric charge trap, a second insulating region containing no electric charge trap, and a third insulating region containing an electric charge trap are disposed in this order in a direction from the first diffusion layer to the second diffusion layer along the channel region of the semiconductor layer.

Another semiconductor device according to the present invention is characterized by having a base substrate comprising a semiconductor layer at least by a surface of the base substrate; a plurality of channel regions formed in the semiconductor layer; a plurality of sets of first and second diffusion layers formed in the semiconductor layer so that each set sandwiches the channel region; a plurality of insulating films formed on the base substrate so as to cover the channel regions, each of the insulating films being extended in a first direction, and the insulating films being juxtaposed in a second direction orthogonal to the first direction; and a plurality of gate electrodes formed on the base substrate via the insulating films, each of the gate electrodes being extended in the first direction, and the gate electrodes being juxtaposed in the second direction; wherein each of the insulating films contains a structure in which a first insulating region containing an electric charge trap, a second insulating region containing no electric charge trap, and a third insulating region containing an electric charge trap are disposed in this order in a direction from the first diffusion layer to the second diffusion layer along the channel region of the semiconductor layer.

A manufacturing method of a semiconductor device according to the present invention is characterized by including a step of forming a recessed portion on a surface of a semiconductor substrate; a step of forming an electric charge accumulating film on the entire surface; a step of removing the electric charge accumulating film by anisotropy etching with the film on a side surface of the recessed portion; a step of forming an insulating film by oxidizing the surface including a bottom portion of the recessed portion and the electric charge accumulating film; a step of forming a gate electrode on the insulating film; and a step of forming source/drain regions on the surface of the semiconductor substrate so as to sandwich the recessed portion by ion implantation.

Another manufacturing method of a semiconductor device according to the present invention is characterized by including a step of forming a projecting portion on a surface of a semiconductor substrate; a step of forming source/drain regions on the surface of the semiconductor substrate by ion implantation so as to sandwich the projecting portion; a step of forming an electric charge accumulating film on the entire surface; a step of removing the electric charge accumulating film by anisotropic etching with the film on a side surface of the projecting portion; a step of forming an insulating film by oxidizing the surface including an upper portion of the projecting portion and an upper portion of the electric charge accumulating film; and a step of forming a gate electrode on the insulating film.

EFFECTS OF INVENTION

According to the present invention, the insulating film on the channel region is formed so that the insulating films containing the electric charge traps sandwich the insulating film containing no electric charge trap; therefore, a trap type memory which is capable of preventing diffusion of the accumulated electric charge between memory nodes and excellent in the rewriting endurance and the retention characteristic of electric charge can be provided. The channel can be three-dimensionally formed; therefore, even when downsizing of the cell area is advanced, a length of the channel length can be ensured, increase of the punch-through current can be suppressed, and a large ON/OFF ratio of the read current can be maintained.

Figure 1A:
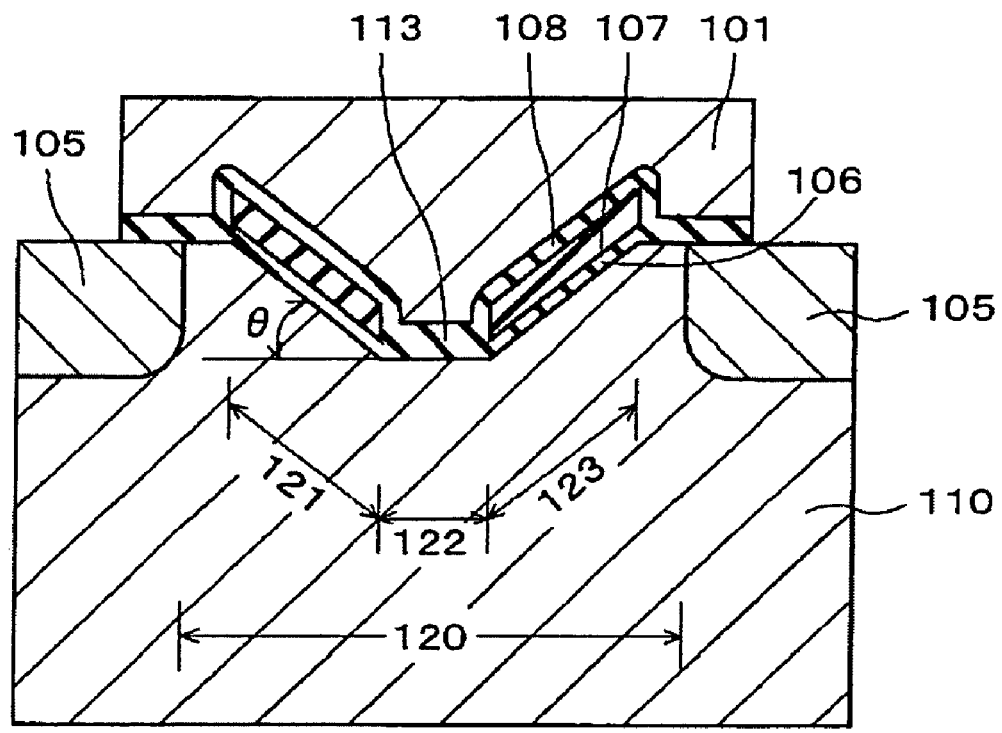
FIGS. 1A and 1B are cross sectional views showing an embodiment of the present invention.

EXPLANATION OF REFERENCE NUMERALS 1, 101 GATE ELECTRODE
2 GATE SIDEWALL
3 SIDEWALL
5, 105 SOURCE/DRAIN REGIONS
6, 106 FIRST GATE INSULATING FILM
7, 107 ELECTRIC CHARGE ACCUMULATING FILM
8, 108 SECOND GATE INSULATING FILM
9 ISOLATION REGION
10 SILICON SUBSTRATE
11, 12 MEMORY NODE
13, 113 THIRD GATE INSULATING FILM
14 SECOND GATE ELECTRODE
15 METAL LAYER
16 HARD MASK
17 RECESSED PORTION
18 PROJECTING PORTION
19 RESIST MASK
20, 120 THREE-DIMENSIONAL CHANNEL PORTION
21 ETCHING PREVENTION LAYER
110 SEMICONDUCTOR SUBSTRATE
121 FIRST INSULATING REGION
122 SECOND INSULATING REGION
123 THIRD INSULATING REGION

BEST MODE FOR CARRYING OUT THE INVENTION

A characteristic of the present invention is that a gate insulating film constituting a trap type memory contains a structure in which a first insulating region containing an electric charge trap, a second insulating region containing no electric charge trap, and a third insulating region containing an electric charge trap are disposed in this order in a direction from one side of source/drain regions (first diffusion layer) to the other side (second diffusion layer) along the channel region.

In this case, the structure may be configured so that the channel region has first to third planes in the order from the first diffusion layer side; a boundary of the first plane and the second plane and a boundary of the second plane and the third plane are formed so as to be practically perpendicular to the direction from the first diffusion layer to the second diffusion layer; the first insulating region is disposed on the first plane; the second insulating region is disposed on the second plane; and the third insulating region is disposed on the third plane. The second plane and the first plane may be orthogonal to each other.

The semiconductor layer on which the trap type memory is formed may be formed of silicon.

Furthermore, the gate insulating film may be formed on the base substrate having the semiconductor layer as a surface thereof so as to further cover part of the first diffusion layer and part of the second diffusion layer.

Furthermore, each of the first and third insulating regions may have first to third layers or first and second layers from the channel region side; each of the first and third layers may contain a layer of silicon oxide or silicon oxynitride; and the second layer may be a layer comprising one material selected from a group consisting of silicon nitride, silicon oxynitride, alumina, hafnium silicate, hafnium oxide, and aluminium silicate.

Furthermore, in a possible configuration, the second plane is practically parallel to a principal surface of the base substrate, and the first plane and the third plane are not practically parallel to the principal surface of the base substrate.

Furthermore, the first to third planes may be crystal planes of the semiconductor layer practically represented by Miller indices (hkl). For example, the combinations shown below are preferred. For example, the first plane may be configured to be practically a (311) crystal plane, a plane crystallographically equivalent to the (311) crystal plane, a crystal plane (100), or a plane crystallographically equivalent to the (100) crystal plane of the semiconductor layer. Alternatively, the second plane may be configured to be practically a (100) crystal plane, a plane crystallographically equivalent to the (100) crystal plane, a crystal plane (110), or a plane crystallographically equivalent to the (110) crystal plane of the semiconductor layer. Furthermore, in a possible configuration, a combination of the first and second planes is practically one combination of crystal planes of the semiconductor layer selected from a group consisting of [(311),(001)], [(100),(011)], and [(311),(011)], and the third plane is practically the same crystal plane as the first plane. Furthermore, in a possible configuration, a combination of the first and second planes is practically a combination of crystal planes of the semiconductor layer [(100),(010)], and the third plane is practically the same crystal plane as the first plane.

Furthermore, the first to third planes may configure a recessed portion formed on the surface of the base substrate, or may configure the projecting portion formed on the surface of the base substrate.

Hereinafter, with reference to appended drawings, a desirable embodiment of the present invention will be explained in detail.

Figure 1B:
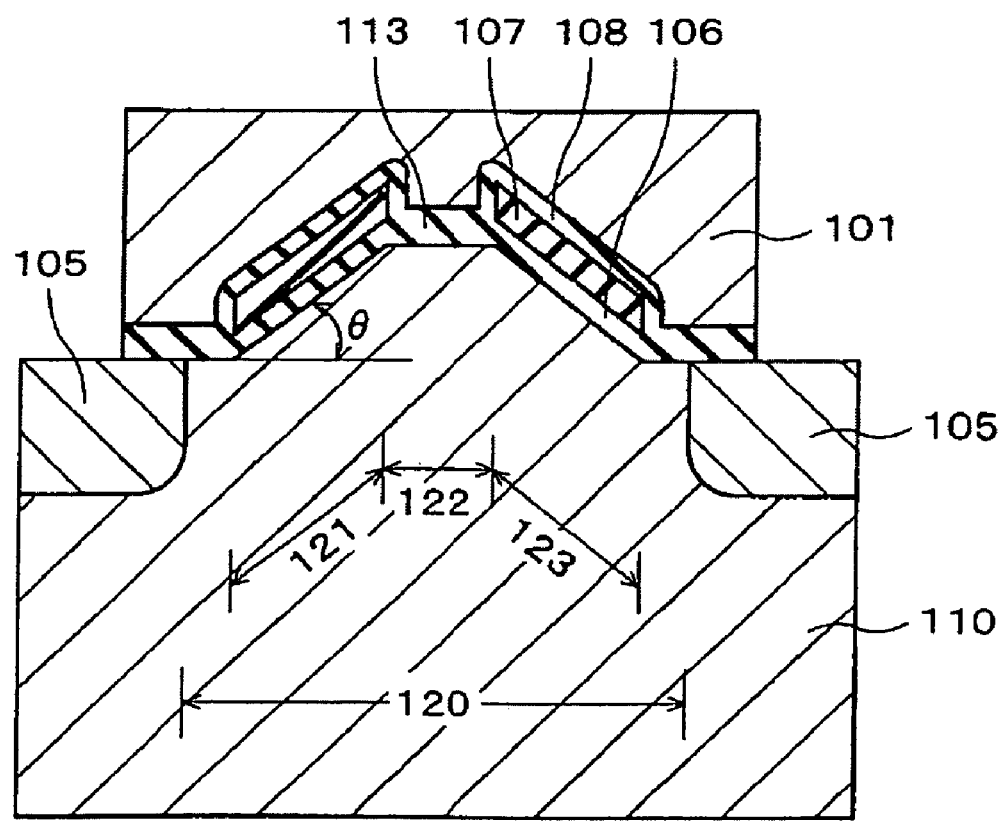

FIGS. 1A and 1B are cross sectional views along the channel-length direction showing structures of non-volatile memory cells of the present invention. FIG. 1A shows an example in which a channel is formed at a recessed portion of a substrate, and FIG. 1B shows an example in which a channel is formed at a projecting portion of a substrate. As shown in FIGS. 1A and 1B, a pair of source/drain regions 105 is formed in a surface region of a semiconductor substrate 110, and a gate electrode 101 is formed on the semiconductor substrate 110 via a gate insulating film. The surface of the semiconductor substrate between the source/drain regions 105 is recessed in the example shown in FIG. 1A and is projecting in the example shown in FIG. 1B, and a three-dimensional channel portion 120 is formed there. The gate insulating film above the channel region has, at least, three regions, which are an insulating region containing no electric charge trap and insulating regions containing electric charge traps formed to sandwich the insulating region containing no electric charge trap in the channel length direction. More specifically, the gate insulating film of a first insulating region 121 has a first gate insulating film 106 containing no electric charge trap, an electric charge accumulating film 107 containing an electric charge trap, and a second gate insulating film 108 containing no electric charge trap; the gate insulating film of a second insulating region 122 has merely a third gate insulating film 113 containing no electric charge trap; and the gate insulating film of a third insulating region 123 contains the first gate insulating film 106 containing no electric charge trap, the electric charge accumulating film 107 containing an electric charge trap, and the second gate insulating film 108 containing no electric charge trap. Therefore, the gate insulating film of the first insulating region 121 and the gate insulating film of the third insulating region 123 independently function as memory nodes, respectively.

Silicon oxide or silicon oxynitride is used as the first gate insulating film 106, the second gate insulating film 108, and the third gate insulating film 113. The first gate insulating film 106 and the second gate insulating film 108 are not required to use the same material, and the first gate insulating film 106 and the third gate insulating film 113 are also not required to use the same material.

A preferred material of the electric charge accumulating film 107 is any of silicon nitride, silicon oxynitride, alumina, aluminium silicate, hafnium oxide, and hafnium silicate.

A silicon substrate is advantageously used as the semiconductor substrate 110; however, it is not limited thereto, and, for example, a silicon-germanium mixed crystal substrate or a Silicon on Insulator (SOI) substrate and the like may be used.

In the examples shown in the drawings, each of the gate insulating films of the first and third insulating regions 121 and 123 comprises the insulating film having three layers, and the gate insulating film of the second insulating region 122 comprises the insulating film having one layer; however, such configurations are not always required, and a single-layer film or a multi-layer film may be used. For example, the first to third gate insulating films may be stacked films of silicon oxide films and silicon oxynitride films or may be stacked films of silicon oxide films or silicon oxynitride films and high-dielectric-constant films. The gate insulating film of the first or third insulating region 121 or 123 may be, for example, a film in which a metal, nano crystal silicon, or the like which serves as an electric charge trap is locally present in an intermediate portion of a single-layered silicon oxide film. The gate insulating film of the first or third insulating region 121 or 123 may be a two-layer film of the first gate insulating film 106 containing no electric charge trap and the electric charge accumulating film 107 containing an electric charge trap.

An important point in the present invention is that the first and third insulating regions 121 and 123 containing electric charge traps are separated from each other in the region facing the channel region 120 by the second insulating region 122 containing no electric charge trap. Thus, diffusion of electric charge between the memory nodes can be effectively reduced, and improvement of the retention characteristic and the rewriting endurance can be expected. In the memory cells shown in the drawings, the gate insulating films of the first, second, and third insulating regions 121, 122, and 123 are formed on different planes of the semiconductor substrate; however, the planes are not always required to be different, and the gate insulating films of the three regions may be formed on the same plane of the semiconductor substrate. The substrate planes of the first and third insulating regions 121 and 123 may be the planes inclined with respect to the substrate plane of the second insulating region 122 or may be the planes perpendicular thereto. Therefore, a preferred range of the angle θ formed by the substrate plane of the first insulating region 121 and the substrate plane of the second insulating region 122 is 0°≦θ≦90°. However, when the channel is three dimensionally formed by 0°<θ≦90°, a long channel length can be ensured, and the punch-through endurance can be improved.

The substrate planes of the first, second, and third insulating regions 121, 122, and 123 can be defined by Miller indices (hkl). Herein, when a (100) plane or a (311) plane is used as the substrate plane of the first or third insulating region 121 or 123 containing an electric charge trap (including the case in which the plane is crystallographically equivalent to the (100) plane or the (311) plane, and the same applies hereinafter), the retention characteristic of accumulated electric charge can be maintained well, and leakage of the electric charge from an electron trap layer is reduced. This is for the reason that the interface state density of an oxide film formed on a wafer surface is different depending on the plane orientation of the wafer, and the magnitude relation of the interface state density is (110)>(111)>>(100)>(311). Thus, leakage of the accumulated electric charge can be reduced by improving the film quality of the first gate insulating film 106, which is a base oxide film, and improving the quality of the substrate/oxide film interface.

Meanwhile, the electron mobility is high on the (100) plane, and the hole mobility is high on the (110) plane. Therefore, when the (100) plane or the (110) plane is used as the substrate plane of the second insulating region 122 containing no electric charge trap, a drain current can be increased. Therefore, when the combination of the crystal plane on which the insulating film containing the electric charge trap is formed and the crystal plane (the crystal plane parallel to the semiconductor substrate) on which the insulating film layer containing no electric charge trap is formed uses the combination of A: [(311),(011)], B: [(100),(011)], or C: [(311),(011)], leakage of the accumulated electric charge can be reduced while increasing the read electrons and hole current of the memory cell (in the case in which the two crystal planes are not orthogonal to each other). In order to enhance the retention characteristic of the memory cell while maintaining a high current of a p-channel MOS transistor of Complementary Metal Oxide Semiconductor (CMOS), the above described combination B or C is effective. However, in this case, the read current of the memory portion may be lowered depending on the direction of the electronic current in the (011) plane. When the combination of [(100),(010)] is used, leakage of the accumulated electric charge can be reduced while increasing the read electronic current of the memory cell (in the case in which the two crystal planes are orthogonal to each other).

As described above, the (311) plane or the (100) plane is preferably used as the substrate plane of the first and third insulating regions 121 and 123, and the (100) plane or the (110) plane is preferably used as the substrate plane of the second insulating region 122; however, the present invention is not limited to these crystal planes. The above described plane orientations are not strictly limited to the case in which they are flat surfaces, but may be also applied to the case of curved surfaces wherein slight curvature is generated due to, for example, process deformation. Particularly, a joint part of a plane and another plane is desired to be rounded and to be a surface having curvature.

A reading operation with respect to the memory cell of the present invention is carried out by applying a positive voltage to either one of the source/drain regions 105 and the gate electrode 101. In this process, electrons flow from the source (the region of the side to which the positive voltage is not applied) so as to circumvent the recessed portion or the projecting portion of the substrate. When electrons have not been injected into the electric charge accumulating film 107 of the side serving as the source, a large current flows therethrough; however, when electrons are accumulated therein, an electronic current does not readily flow between the source and the drain. Therefore, a writing state can be detected by reading the electronic current value at a predetermined application voltage.

In a writing operation, channel hot electrons are used. When electrons are to be injected into the electric charge accumulating film 107, a positive high voltage is applied to the gate electrode 101 and one of the source/drain regions 105, thereby generating hot electrons in the vicinity of the region 105 to which the positive high voltage is applied and injecting the electrons into the electric charge accumulating film 107 of the side of the region to which the high voltage is applied.

In an erasing operation, Band To Band Tunneling (BTBT) is used. When the electrons of the electric charge accumulating film 107 are to be erased, a positive voltage is applied to the source/drain region 105 of the side of the electric charge accumulating film 107 which is to be erased, and a negative voltage is applied to the gate electrode 101, thereby generating holes in an overlapping region of the gate electrode 101 and the region 105, to which the positive voltage is applied, and injecting the holes into the electric charge accumulating film 107. The injected holes neutralize the electrons, thereby erasing the accumulated electric charge.

In the semiconductor device of the present invention, the channel region is three-dimensionally formed and comprises three crystal planes; therefore, the cell area can be reduced while maintaining an effective gate length, and increase of the punch-through current and reduction of the ON/OFF ratio of the read current can be suppressed. Moreover, the left and right electric charge accumulating layers are divided from each other; therefore, electric charge is not moved between the memory nodes, and excellent rewriting endurance and retention characteristic can be realized. Furthermore, the above described crystal plane of the channel region in which the insulating film layer containing no electronic trap is formed is caused to be same as the crystal plane of the semiconductor substrate, and crystal planes which are symmetrical in left and right are formed; therefore, equivalent electric characteristics are obtained even when the source/drain are switched, and it operates as an ideal 2-bit/cell memory transistor.

First Embodiment

Figure 2:
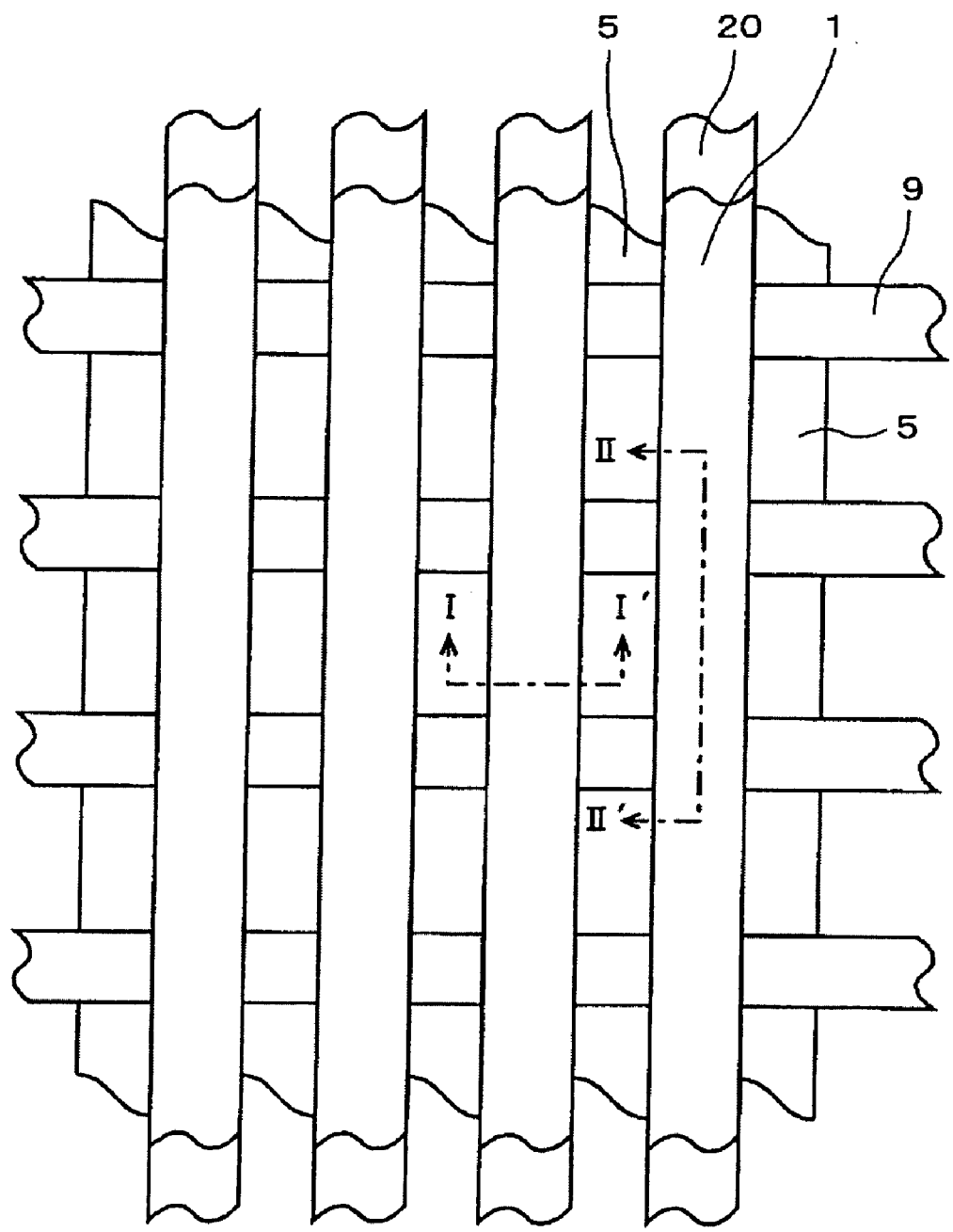
FIG. 2 is a plan view of a first example of the present invention.

FIG. 2 shows a plan view of a first example. As shown in FIG. 2, in a trap type memory, isolation regions 9 are disposed in predetermined regions of a semiconductor substrate and restrict active regions including source/drain regions 5. A plurality of three-dimensional channel portions 20 are formed so as to be sandwiched by the source/drain regions 5 and orthogonal to the isolation regions 9. In addition, gate electrodes 1 are formed so as to cover the three-dimensional channel portions and part of the source/drain regions 5 and to be parallel to the three-dimensional channel portions 20.

Figure 3A:
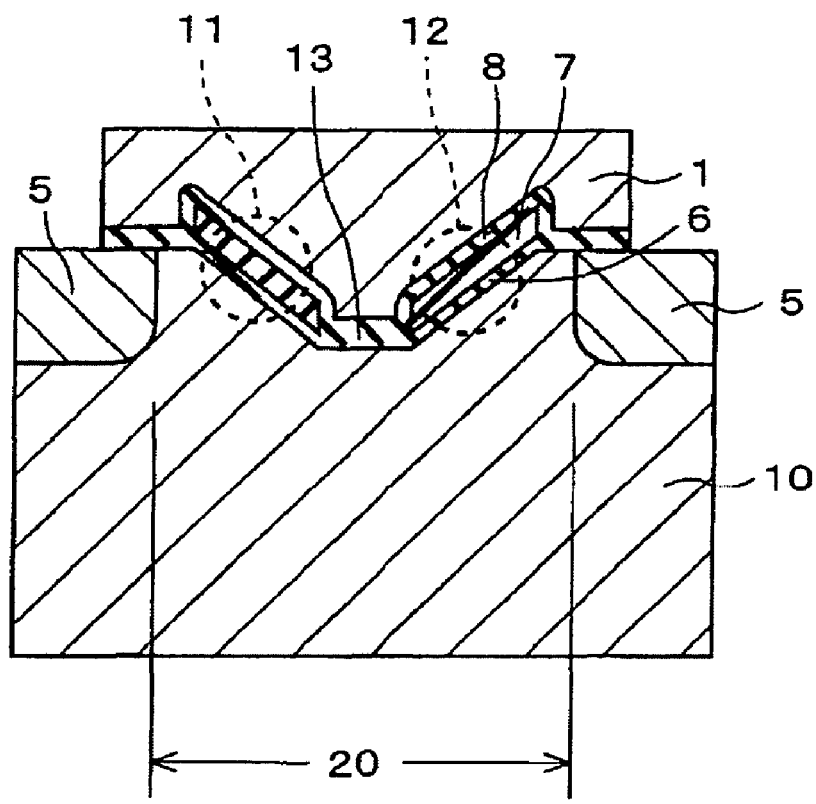
FIG. 3A is a cross sectional view taken along the line I-I' shown in FIG. 2.
Figure 3B:
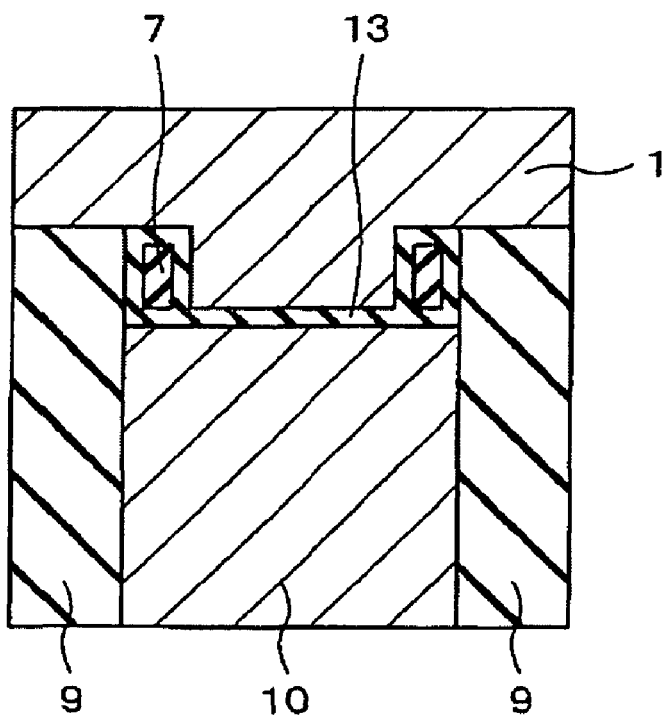
FIG. 3B is a cross sectional view taken along the line II-IF shown in FIG. 2.

FIG. 3A is a cross sectional view taken along the line I-I' shown in FIG. 2, and FIG. 3B is a cross sectional view taken along the line II-II' shown in FIG. 2. As shown in FIGS. 3A and 3B, in the cross section of the I-I' line, diffusion layers of a second conduction type which serve as the source/drain regions 5 are formed on the silicon substrate 10 of a first conduction type, and the three-dimensional channel portion 20 is formed so as to be sandwiched by the source/drain regions 5. The gate electrode 1 is formed so as to cover the entirety of the three-dimensional channel portion 20 and part of the source/drain regions 5. The three-dimensional channel portion 20 is formed by three crystal planes. The center plane is same as the crystal plane of the silicon substrate 10, wherein a third gate insulating film 13 containing no electronic trap is formed between the gate electrode 1 and the plane. Between each of the left and right symmetrical planes and the gate electrode 1, a gate insulating film comprising a first gate insulating film 6, an electric charge accumulating film 7, and a second gate insulating film 8 is formed. The gate insulating films containing the electric charge accumulating films 7 form electric charge trap layers and function as memory nodes 11 and 12, respectively. The case in which the first gate insulating films 6 on the symmetrical left and right planes are not in contact with the source/drain regions 5 is shown; however, they may be in contact with each other. In the present example, as shown in FIG. 3B, which is a cross sectional view taken along the line of FIG. 2, the regions containing electric charge traps are also formed in the regions facing the isolations 9. More specifically, in FIG. 3A, which is a cross sectional view taken along the line of FIG. 2, the first insulating region and the third insulating regions both containing electric charge traps are connected to each other via the electric charge accumulating film 7 formed in the regions facing the isolations 9. Note that the first insulating region corresponds to the first insulating region 121 shown in FIG. 1A, and the third insulating region corresponds to the third insulating region 123 shown in FIG. 1A. However, in the regions facing the isolations 9, the amount of electric charge injected upon writing/erasing is extremely small compared with the part facing the channel region and does not affect the threshold voltage. Therefore, the configuration of the present example does not contribute to deterioration of the retention characteristic of written electric charge and rewriting endurance and to increase of the erasing VT (threshold voltage).

In the present example, the (311) plane is used as the crystal plane on which the insulating film containing electric charge traps is formed, and the (100) plane is used as the crystal plane on which the silicon substrate and the insulating film parallel thereto and containing no electric charge trap are formed.

Hereinafter, a manufacturing method of the first example will be briefly explained. FIGS. 4A to 4H are cross sectional views in the order of steps showing the manufacturing method of the trap type memory of the first example and are showing the states in the cross section along the line I-I' of FIG. 2.

Figure 4A:
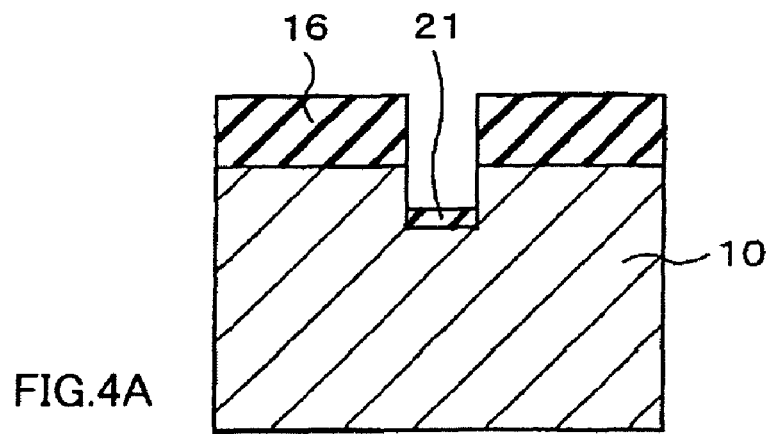
FIGS. 4A to 4H are cross sectional views in the order of steps showing a manufacturing method of the first example of the present invention.

First, as shown in FIG. 4A, a patterned hard mask 16 is formed on the silicon substrate 10, and a recessed portion is formed by subjecting the silicon substrate 10 to dry etching while using the hard mask 16 as a mask. The silicon substrate used the (100) plane as a principal surface. A silicon nitride film formed by using the Chemical Vapor Deposition (CVD) method was used herein as a hard mask material. Furthermore, oxygen injection is carried out by using the hard mask 16 as a mask, and thermal treatment is carried out, thereby forming a silicon oxide film, which serves as an etching prevention layer 21, on a bottom part of the recessed portion.

Figure 4B:
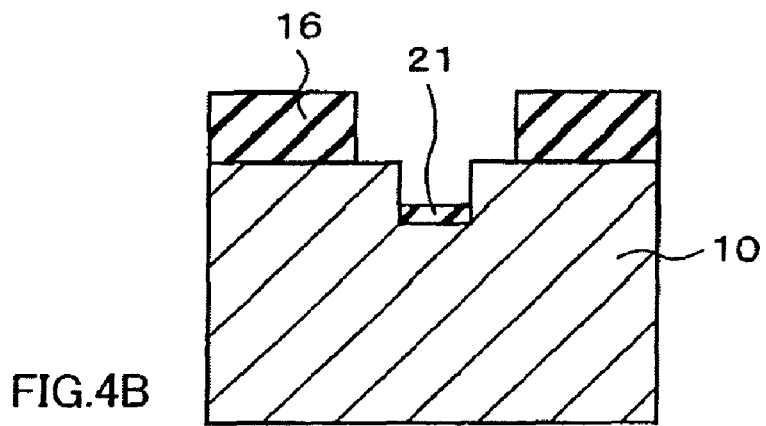

Next, as shown in FIG. 4B, the hard mask 16 is caused to recede by using the wet etching method, thereby forming an offset between the mask and the recessed portion. Phosphoric acid was used in the wet etching.

Figure 4C:
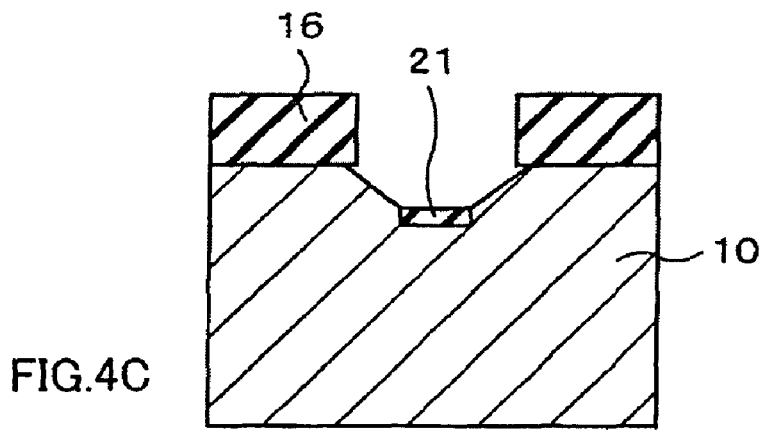

Subsequently, as shown in FIG. 4C, silicon wet etching is carried out by using the hard mask 16 and the etching prevention layer 21 as etching masks, thereby causing the (311) plane to be exposed on the side surface of the recessed portion. Herein, ($N_2H+4H_2O$) was used in the wet etching.

Figure 4D:
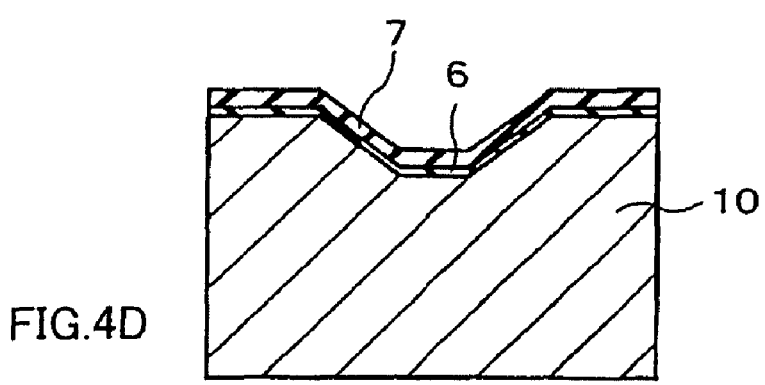

Next, after the hard mask 16 and the etching prevention layer 21 are removed, as shown in FIG. 4D, the entire substrate is oxidized, thereby forming the first gate insulating film 6, and a silicon nitride film which serves as the electric charge accumulating film 7 is deposited thereon by using the CVD method. Note that, in the oxidation, radical oxidation or the like having small surface orientation dependency of the oxidation rate is desirably used. Herein, the In Situ Steam Generation (ISSG) method is used in the oxidation.

Figure 4E:
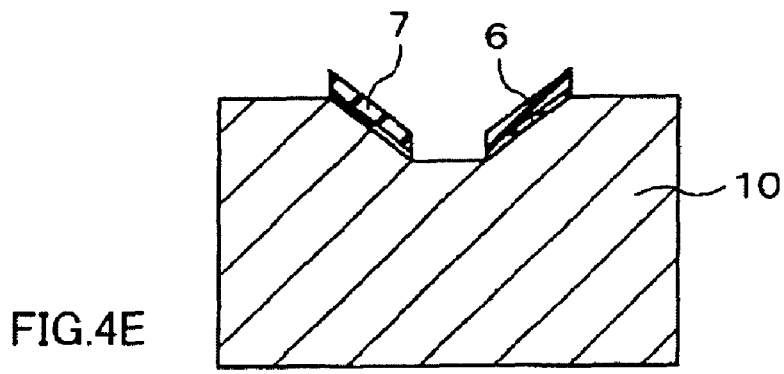

Next, as shown in FIG. 4E, after a resist mask is formed on the (311) plane, nitride film dry etching and oxide film dry etching is successively carried out, thereby removing the electric charge accumulating film 7 and the first gate insulating film 6 on the wafer principal surface and on the recess bottom portion by etching. Then, the resist mask was removed.

Figure 4F:
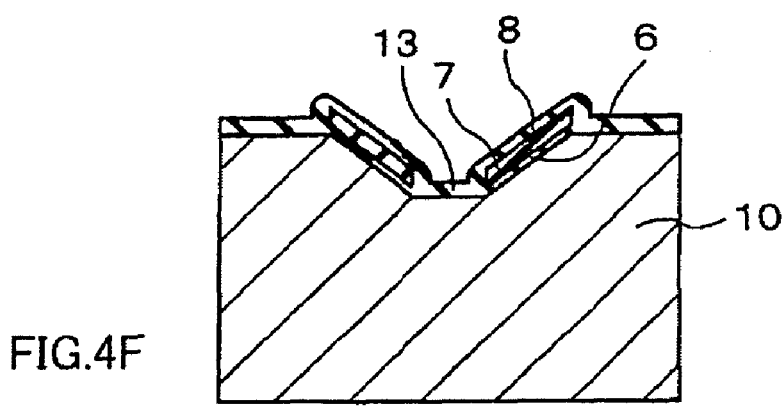

Next, as shown in FIG. 4F, the electric charge accumulating film 7 (silicon nitride film), the recess bottom portion, and the wafer principal surface were oxidized, thereby forming the second gate insulating film 8 and the third gate insulating film 13. The oxidation herein is also desired to use, for example, radical oxidation having small surface orientation dependency of the oxidation rate. Herein, the ISSG method is used in oxidation.

Figure 4G:
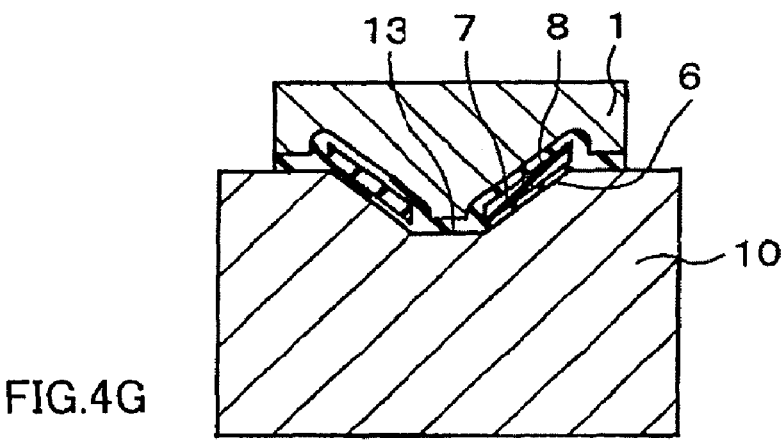

Next, as shown in FIG. 4G, a phosphorous-added silicon film was deposited on the entire wafer surface by using the CVD method, and the gate electrode 1 was formed by carrying out dry etching by using a patterned resist mask, which is patterned in the shape of the gate. After the dry etching, the resist mask was removed.

Figure 4H:
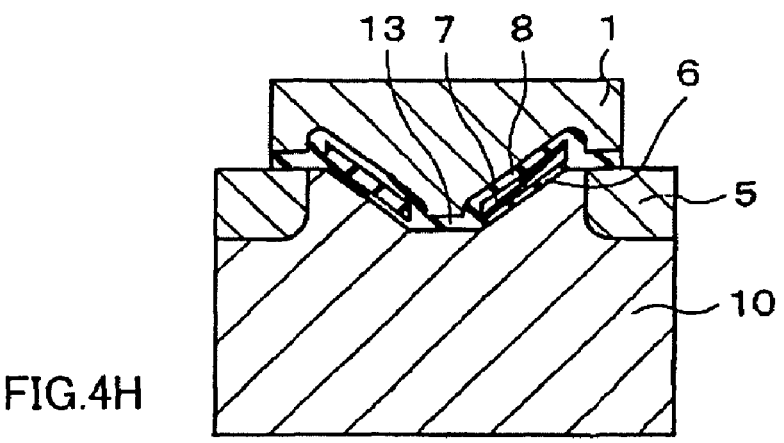

Lastly, as shown in FIG. 4H, an impurity of a second conduction type was injected, thereby forming the source/drain regions 5. Note that, after the step of FIG. 4H, in order to reduce the resistance value of each part, upper portions of the source, drain, and gate electrodes are desired to be caused to be silicide after formation of the gate sidewalls.

Second Embodiment

Figure 5:
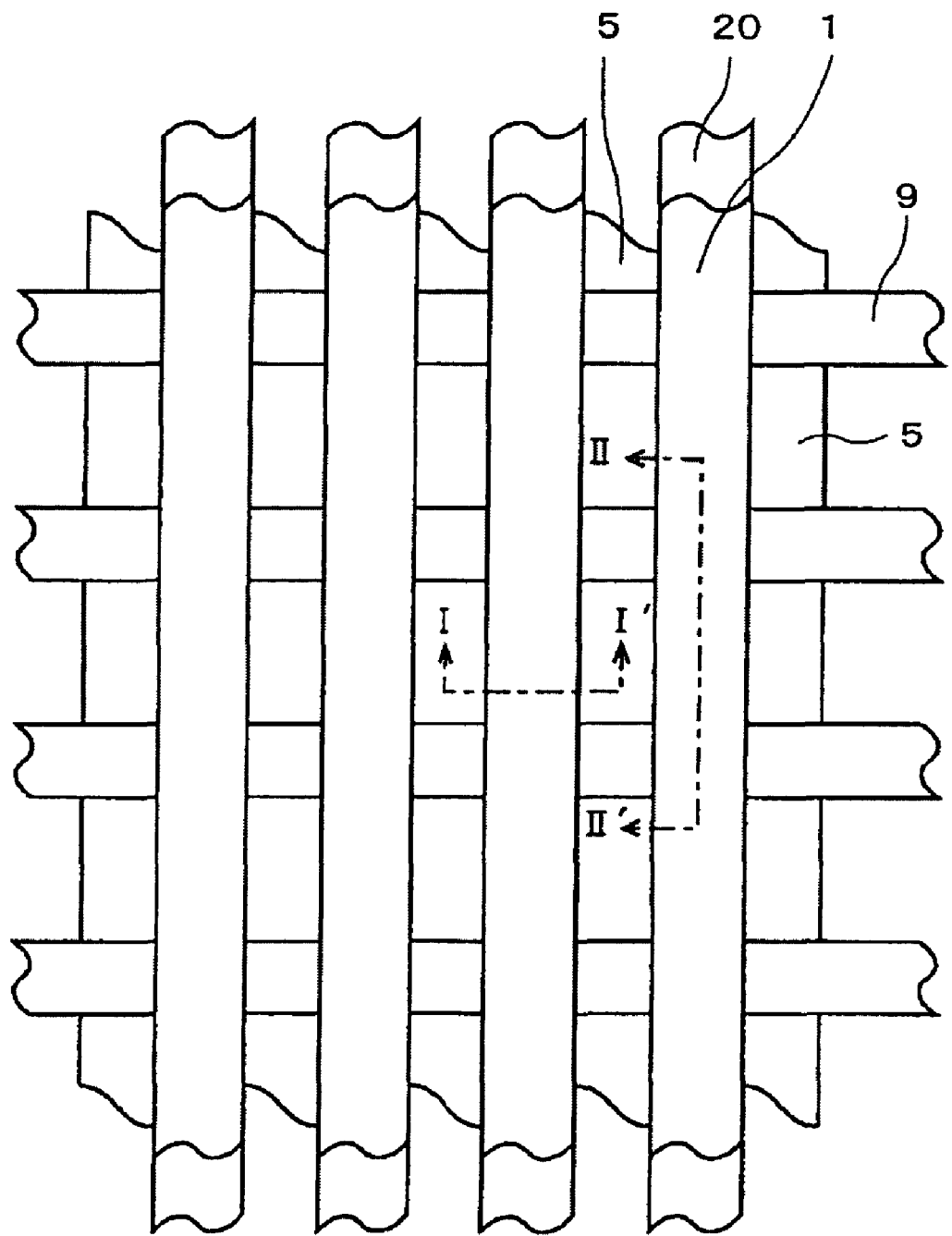
FIG. 5 is a plan view of a second example of the present invention.

FIG. 5 shows a plan view of a second example. As shown in FIG. 5, in a trap type memory, isolation regions 9 are disposed at predetermined regions of a semiconductor substrate and restrict active regions including the source/drain regions 5. A plurality of three-dimensional channel portions 20 are formed so as to be sandwiched by the source/drain regions and be orthogonal to the isolation regions 9. In addition, the gate electrodes 1 are formed so as to cover the three-dimensional channel portions and part of the source/drain regions and to be parallel to the three-dimensional channel portions.

Figure 6A:
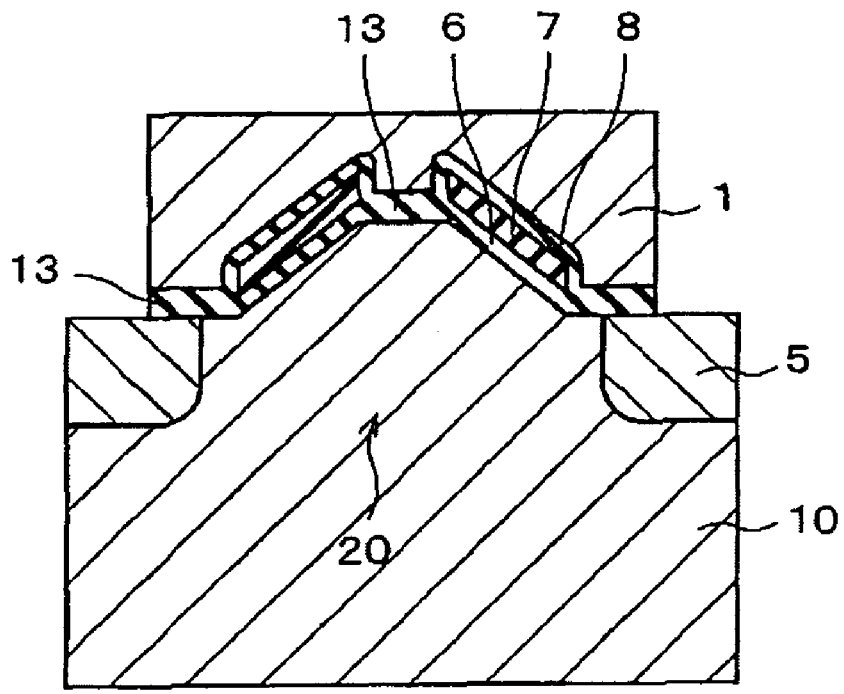
FIG. 6A is a cross sectional view taken along the line I-I' shown in FIG. 5.
Figure 6B:
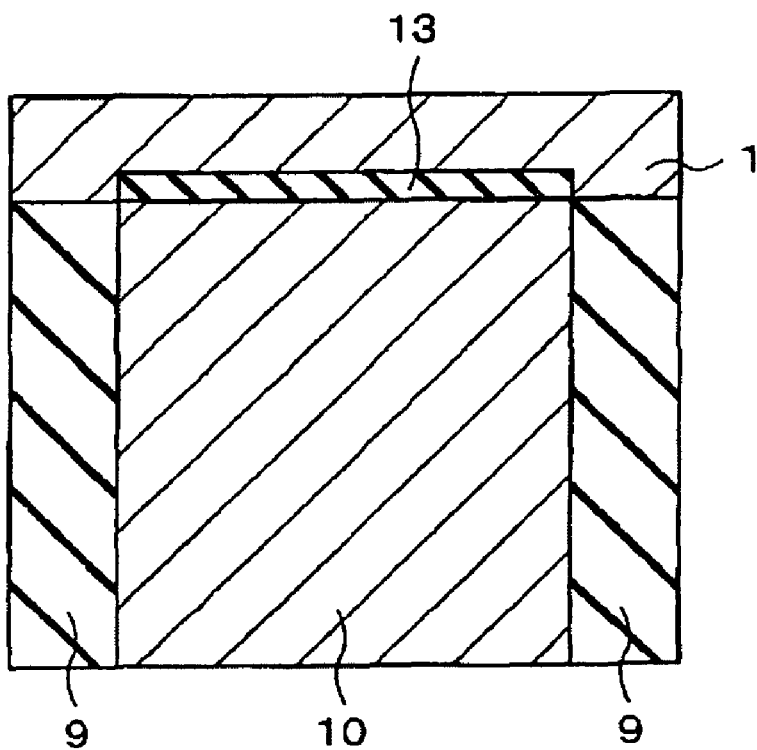
FIG. 6B is a cross sectional view taken along the line shown in FIG. 5.

FIG. 6A is a cross sectional view taken along the line I-I' shown in FIG. 5, and FIG. 6B is a cross sectional view taken along the line II-II' shown in FIG. 5. As shown in FIGS. 6A and 6B, in the cross section of the line I-I', a diffusion layer of the second conduction type which serves as the source/drain regions 5 is formed on the silicon substrate 10 of the first conduction type, and the three-dimensional channel portion 20 projecting from the principal surface of the substrate is formed so as to be sandwiched by the source/drain regions 5. In addition, the gate electrode 1 is formed so as to cover the entirety of three-dimensional channel portion 20 and part of the source/drain regions 5. The three-dimensional channel portion comprises three crystal planes. The center plane is same as the crystal plane of the semiconductor substrate, wherein the above described third gate insulating film 13 containing no electronic trap is formed between the plane and the gate electrode 1. Between each of the left and right symmetrical planes and the gate electrode 1, gate insulating films comprising the first gate insulating film 6, the electric charge accumulating layer 7, and the second gate insulating film 8 is formed. Electronic trap layers are formed by the gate insulating films and function as memory nodes, respectively. Note that, although the case in which the first gate insulating films 6 on the left and right symmetrical planes and the source/drain regions 5 are not in contact with each other is shown, they may be in contact with each other.

Hereinafter, a manufacturing method of the second example will be briefly explained. FIGS. 7A to 7H are cross sectional views in the order of steps showing the manufacturing method of the second example of the present invention and show the cross sections along the line I-I' of FIG. 5.

Figure 7A:
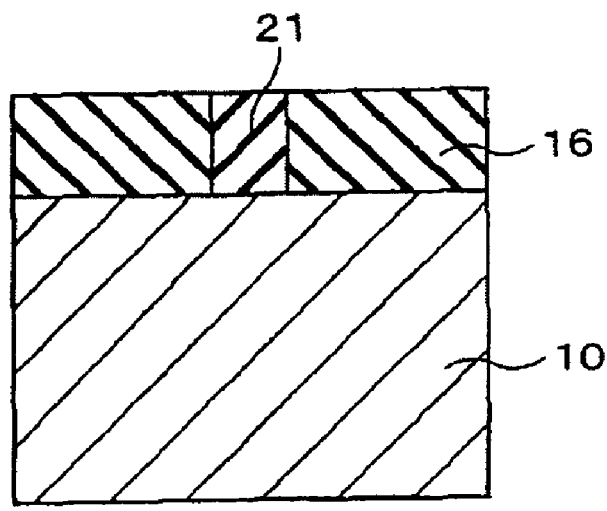
FIGS. 7A to 7H are cross sectional views in the order of steps showing a manufacturing method of the second example of the present invention.

First, as shown in FIG. 7A, a silicon nitride film was deposited on the silicon substrate 10, patterning was carried out to form the hard mask 16 having a groove, and then the etching prevention layer 21 was formed in the groove of the hard mask 16 by deposition of a silicon oxide film and the Chemical Mechanical Polishing (CMP) method. The silicon substrate used the (100) plane as a principal surface, and the CVD method was used in deposition of the silicon nitride film and the silicon oxide film.

Figure 7B:
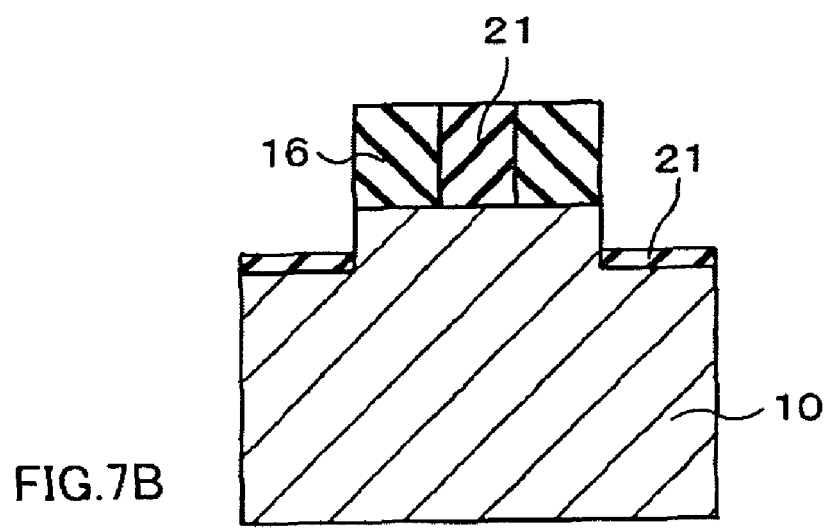

Next, a resist mask was formed, this was used as a mask to carry out dry etching, thereby patterning the hard mask and digging down the silicon substrate to form a projecting portion on the substrate. Next, a silicon oxide film was deposited by using the collimated sputtering method, thereby forming the etching prevention layer 21 on the exposed silicon substrate surface. Then, the resist mask was removed together with the silicon oxide film deposited thereon (FIG. 7B).

Figure 7C:
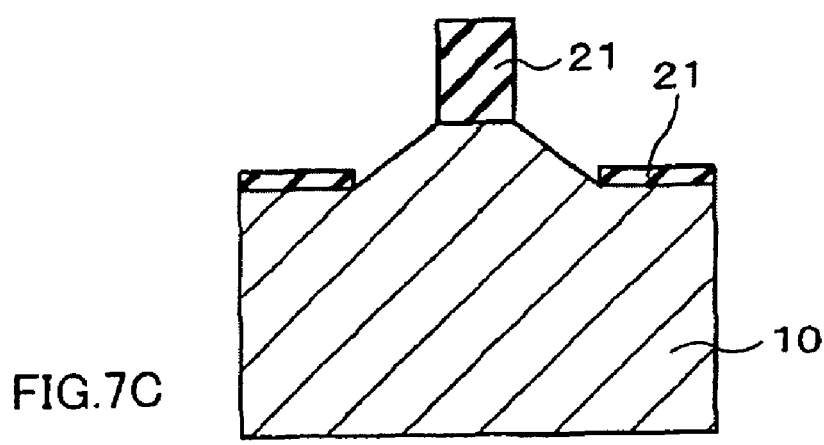

Subsequently, as shown in FIG. 7C, after the hard mask 16 was removed by wet etching, silicon wet etching was carried out by using the etching prevention layer 21 as a mask, thereby exposing the (311) plane in a side part of the projecting portion. Herein, ($N_2H+4H_2O$) was used in the wet etching.

Figure 7D:
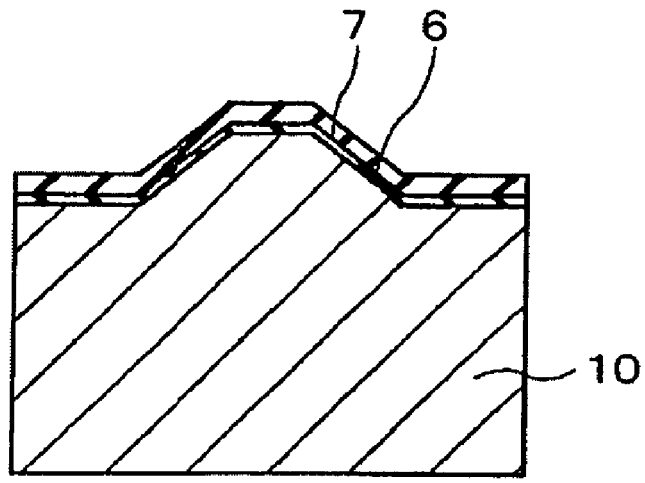

Next, after the etching prevention layer 21 was removed by using buffered hydrofluoric acid (BHF), as shown in FIG. 7D, the first gate insulating film 6 is formed by oxidizing the entire substrate, and a silicon nitride film which serves as the electric charge accumulating layer 7 is deposited thereon by using the CVD method. Note that, in the oxidation, radical oxidation or the like having small surface orientation dependency of the oxidation rate is desirably used. Herein, the ISSG method was used in the oxidation.

Figure 7E:
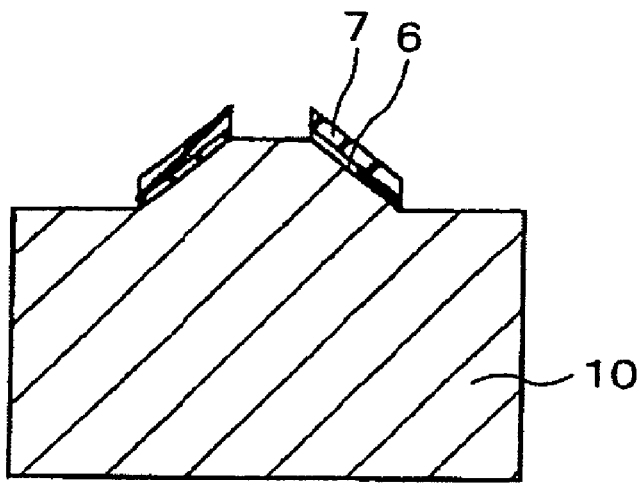

Next, as shown in FIG. 7E, after a resist mask was formed on the (311) plane, nitride film dry etching and oxide film dry etching was successively carried out, thereby removing the electric charge accumulating layer 7 and the first gate insulating film 6 on the wafer principal surface and on the top portion of the projecting portion. Then, the resist mask was removed.

Figure 7F:
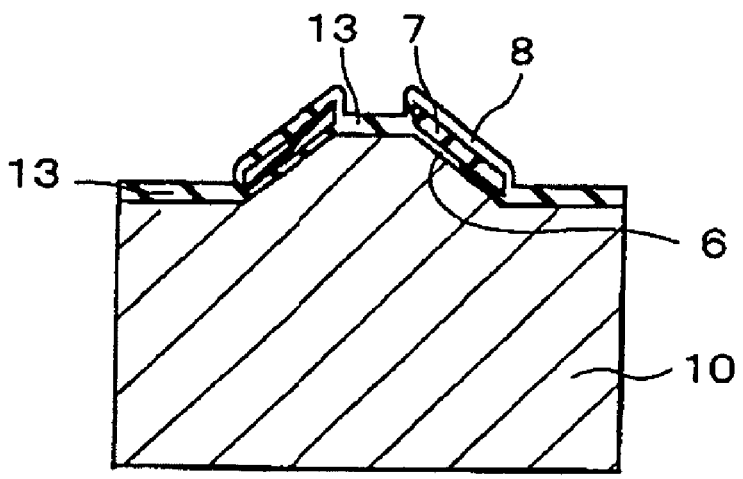

Next, as shown in FIG. 7F, the electric charge accumulating layer 7 (silicon nitride film), the top portion of the projecting portion, and the wafer principal surface were oxidized, thereby forming the second gate insulating film 8 and the third gate insulating film 13. Also in the oxidation herein, radical oxidation or the like having small surface orientation dependency of the oxidation rate is desirably used. Herein, the ISSG method was used in the oxidation.

Figure 7G:
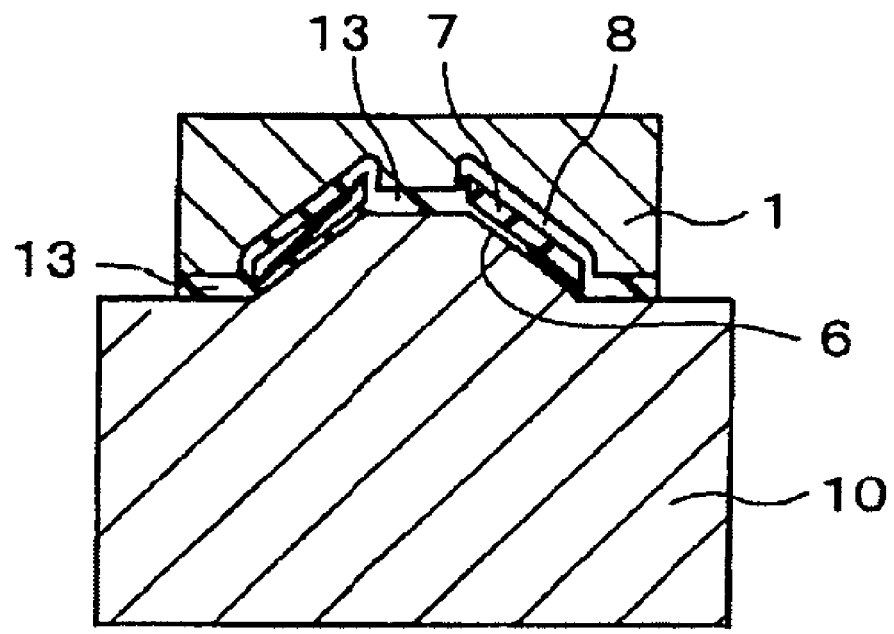

Next, as shown in FIG. 7G, the phosphorous-added silicon film 1 was deposited on the entire wafer surface by using the CVD method, and dry etching was carried out by using the resist mask which is patterned in the shape of the gate, and the electrodes were formed. After the dry etching, the resist mask was removed.

Figure 7H:
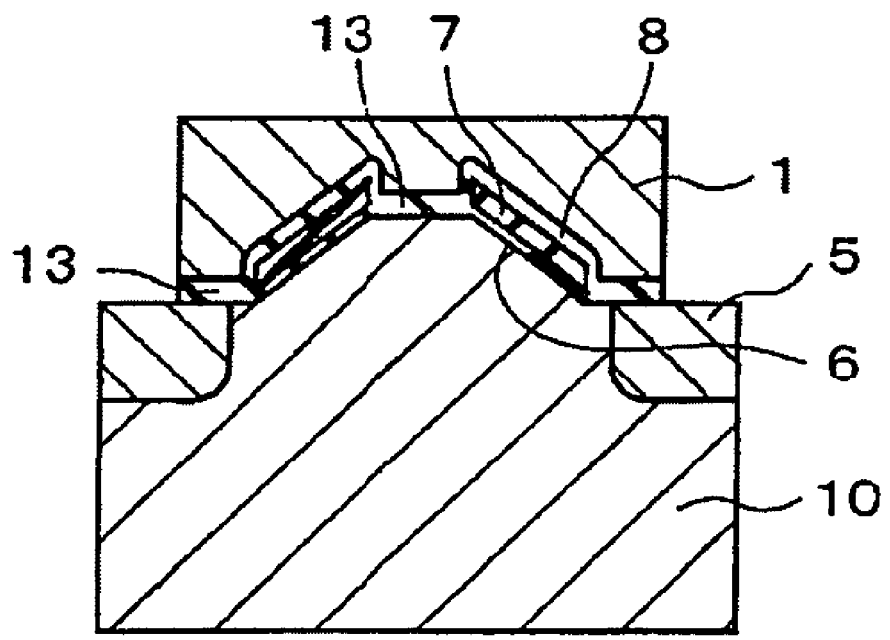

Lastly, as shown in FIG. 7H, an impurity of the second conduction type was injected, thereby forming the impurity diffusion layer serving as the source/drain regions 5. After the step of FIG. 7H, in order to reduce the resistance value of each part, upper portions of the source, drain, and gate electrodes are desired to be caused to be silicide after formation of the gate sidewalls.

Third Embodiment

Figure 8:
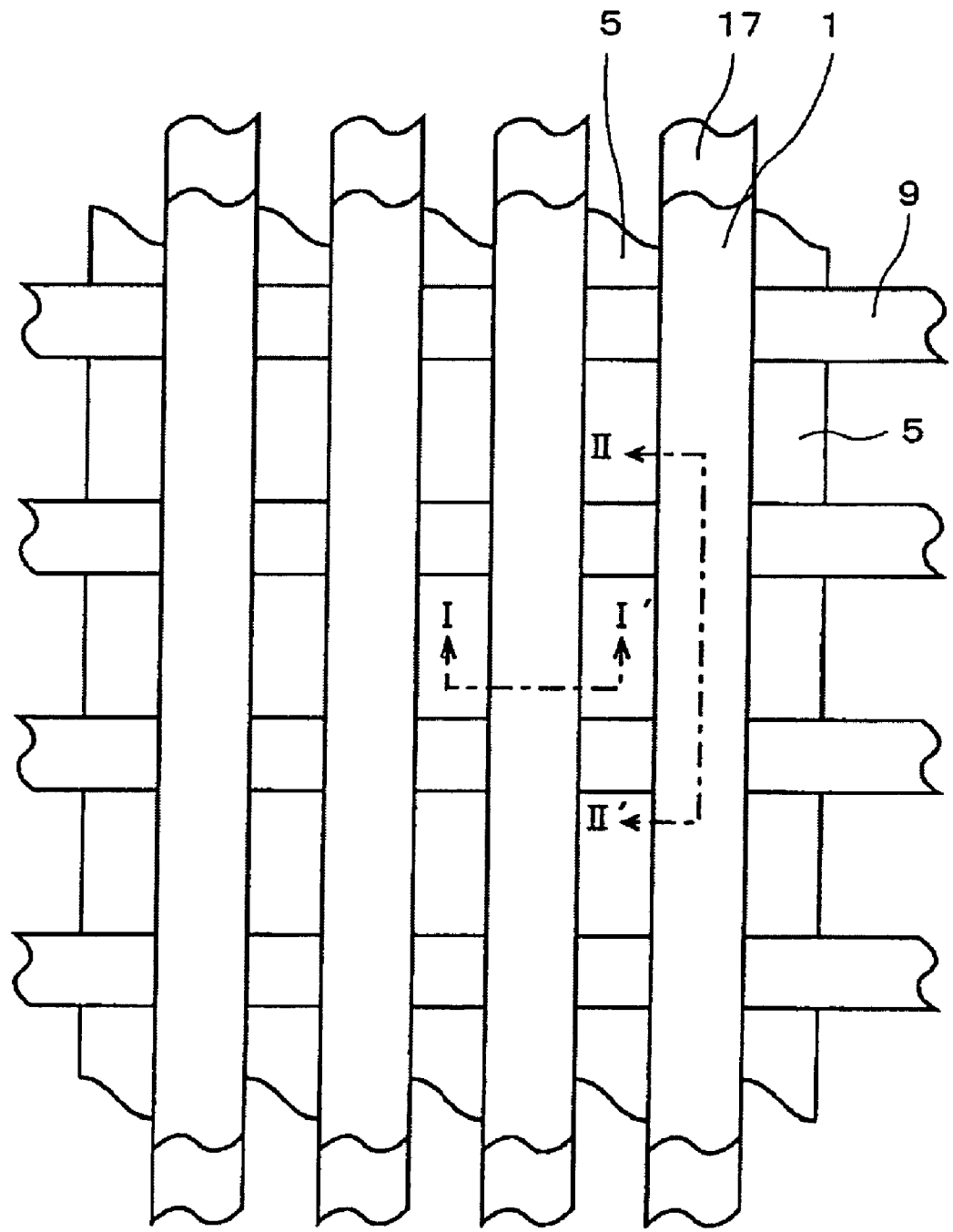
FIG. 8 is a plan view of a third example of the present invention.

FIG. 8 shows a plan view of a trap type memory of a third example. As shown in FIG. 8, the isolation regions 9 are disposed in predetermined regions of a semiconductor substrate and restrict active regions including the source/drain regions 5. A plurality of recessed portions 17 are formed so as to be sandwiched by the source/drain regions 5 and orthogonal to the isolation regions 9. In addition, the gate electrodes 1 are formed so as to cover the recessed portions 17 and part of the source/drain regions 5 and to be parallel to the recessed portions.

Figure 9A:
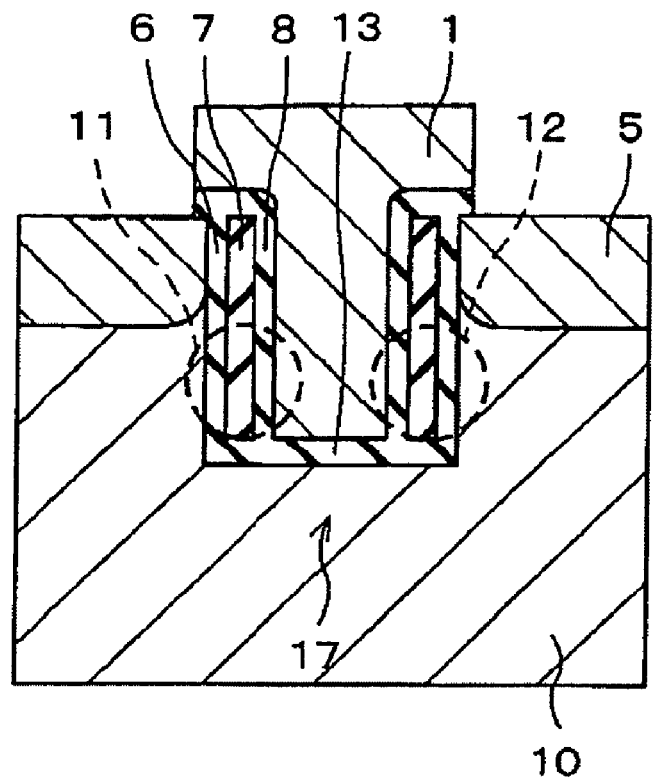
FIG. 9A is a cross sectional view taken along the line I-I' shown in FIG. 8.
Figure 9B:
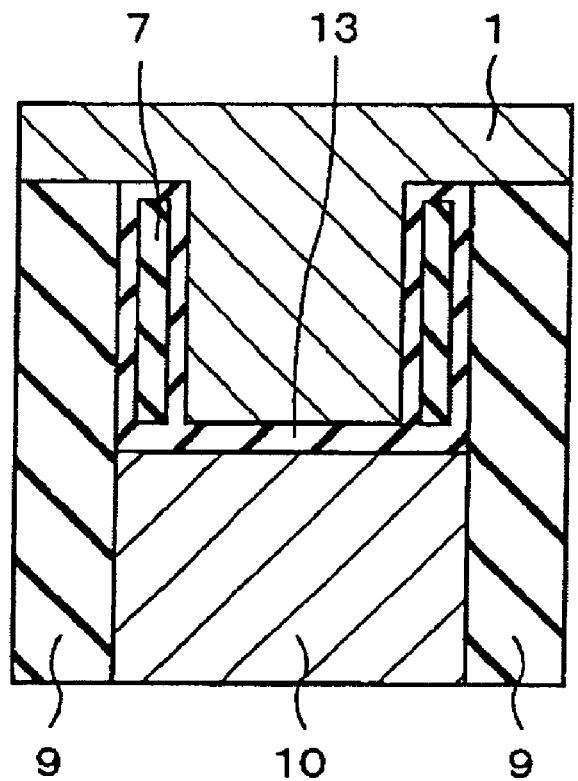
FIG. 9B is a cross sectional view taken along the line II-II' shown in FIG. 8.

FIG. 9A is a cross sectional view taken along the line I-I' shown in FIG. 8, and FIG. 9B is a cross sectional view taken along the line II-II' shown in FIG. 8. As shown in FIGS. 9A and 9B, in the cross section of the line I-I', a diffusion layer of the second conduction type which serve as the source/drain regions 5 are formed on the silicon substrate 10 of the first conduction type, and the recessed portion 17 is formed so as to be sandwiched by the source/drain regions 5. In addition, the gate electrode 1 is formed so as to cover the entirety of the recessed portion 17 and part of the source/drain regions 5. The first gate insulating film 6, the electric charge accumulating film 7, and the second gate insulating film 8 are successively formed only in the sidewall portions of the recessed portion between the recessed portion 17 and the gate electrode 1, and the two electric charge trap layers function as memory nodes 11 and 12, respectively. The third gate insulating film 13 is formed on a bottom portion and part of an upper surface of the recessed portion.

In the present example, the sidewall portion of the recessed portion of the silicon substrate 10 uses the (010) plane, and the recess bottom portion uses the (100) plane.

In order to improve the read current, corners of the recessed portion are desired to have undergone a rounding process.

Note that, although the case in which the first gate insulating films 6 on the left and right symmetrical planes and the source/drain regions 5 are not in contact with each other is shown, they may be in contact with each other. In the present example, as shown in FIG. 9B, which is a cross section taken along the line II-II' of FIG. 8, the regions including electric charge traps are formed also in the regions facing the isolations 9. More specifically, in FIG. 9A, which is a cross section taken along the line I-I' of FIG. 8, the first insulating region and the third insulating region both including electric charge traps are connected via the electric charge accumulating film 7 formed in the regions facing the above described isolations 9. Note that the first insulating region corresponds to the first insulating region 121 shown in FIG. 1A, and the third insulating region corresponds to the third insulating region 123 shown in FIG. 1A. However, in the regions facing the isolations 9, the amount of electric charge injected upon writing/erasing is extremely small compared with the part facing the channel region and does not affect the threshold voltage. Therefore, the configuration of the present example does not contribute to deterioration of the retention characteristic of written electric charge and the rewriting endurance and to increase of the erasing VT (threshold voltage).

Hereinafter, a manufacturing method of the trap type memory of the third example will be briefly explained. FIGS. 10A to 10H are cross sectional views in the order of steps showing the manufacturing method of the third example of the present invention and show the cross sectional views along the line I-I' of FIG. 8.

Figure 10A:
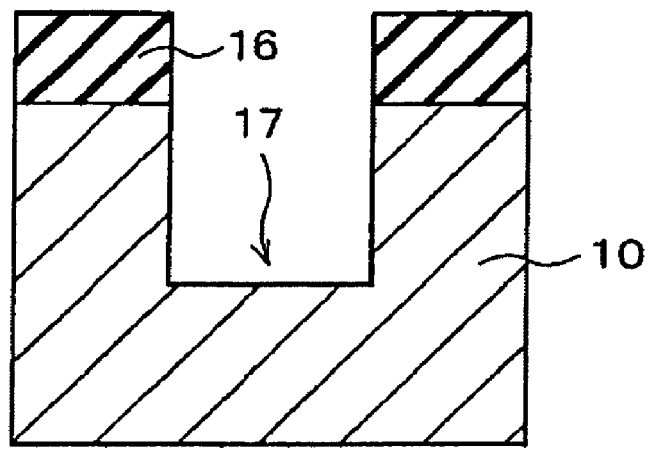
FIGS. 10A to 10H are cross sectional views in the order of steps showing a manufacturing method of the third example of the present invention.

First, as shown in FIG. 10A, the patterned hard mask 16 is formed on the silicon substrate 10 using the (100) plane as a principal surface, and the silicon substrate 10 is dry-etched by using the hard mask 16 as a mask, thereby forming the recessed portion 17 in which the (010) plane is exposed on the side surfaces thereof. A silicon nitride film formed by using the CVD method is used herein as the hard mask material.

Figure 10B:
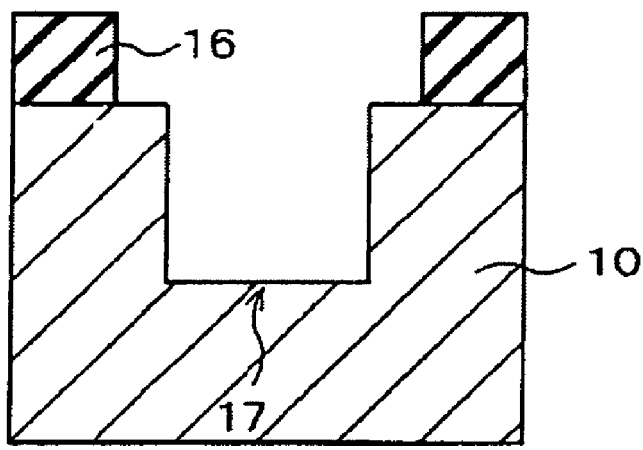

Next, as shown in FIG. 10B, the hard mask 16 was caused to recede by using the wet etching method, in other words, the opening of the hard mask 16 was widened, and offset between the mask and the recessed portion 17 was formed. This step is not always necessary; however, an impurity can be prevented from being implanted into the electric charge accumulating layer in ion implantation at the gate electrode, which is carried out later, and this is effective from the viewpoint of improvement of the retention characteristic.

Figure 10C:
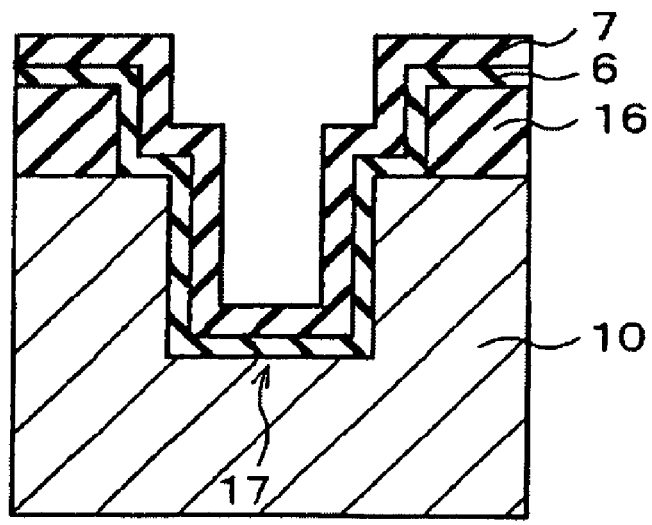

After wafer cleaning, as shown in FIG. 10C, the entire surface of the substrate was oxidized, thereby forming the first gate insulating film 6, and a silicon nitride film was deposited thereon by using the CVD method, thereby forming the electric charge accumulating film 7. Note that, in the oxidation, radical oxidation or the like having small surface orientation dependency of the oxidation rate is desirably used. Herein, the ISSG method is used in the oxidation.

Figure 10D:
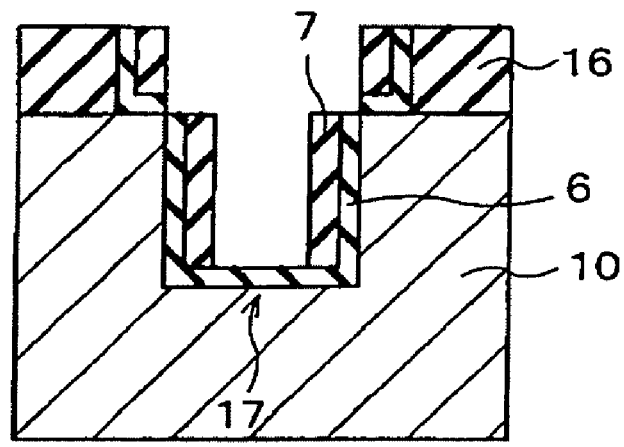

Next, as shown in FIG. 10D, silicon nitride film dry etching and silicon oxide film dry etching was successively carried out, thereby removing the electric charge accumulating film 7 and the first gate insulating film 6 by etching except for the side surface part of the hard mask 16 and the side surface part of the recessed portion 17.

Figure 10E:
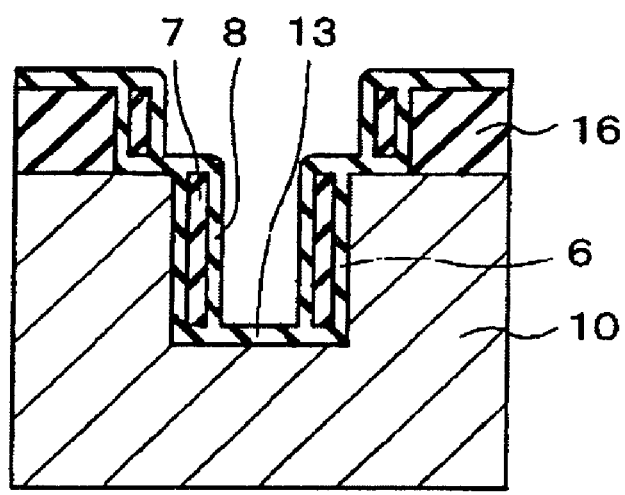

Next, as shown in FIG. 10E, the surfaces of the electric charge accumulating film 7, which is a silicon nitride film, the hard mask 16, and the bottom portion of the recessed portion were oxidized, thereby forming the second gate insulating film 8 and the third gate insulating film 13. Also in this oxidation, radical oxidation or the like having small surface orientation dependency of the oxidation rate is desirably used. Herein, the ISSG method is used in the oxidation.

Figure 10F:
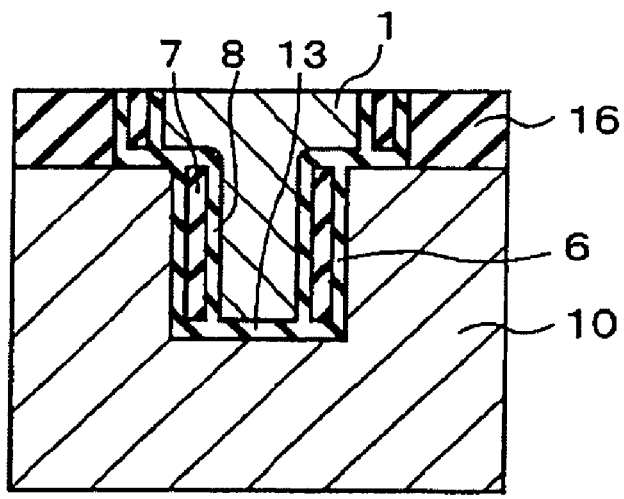

Next, as shown in FIG. 10F, a phosphorous-added silicon film was deposited on the entire surface of the wafer by using the CVD method and planarized by using the CMP method, thereby forming the gate electrode 1. Note that polishing by the CMP method was stopped at the point when the phosphorous-added silicon film on the hard mask 16 was completely removed.

Figure 10G:
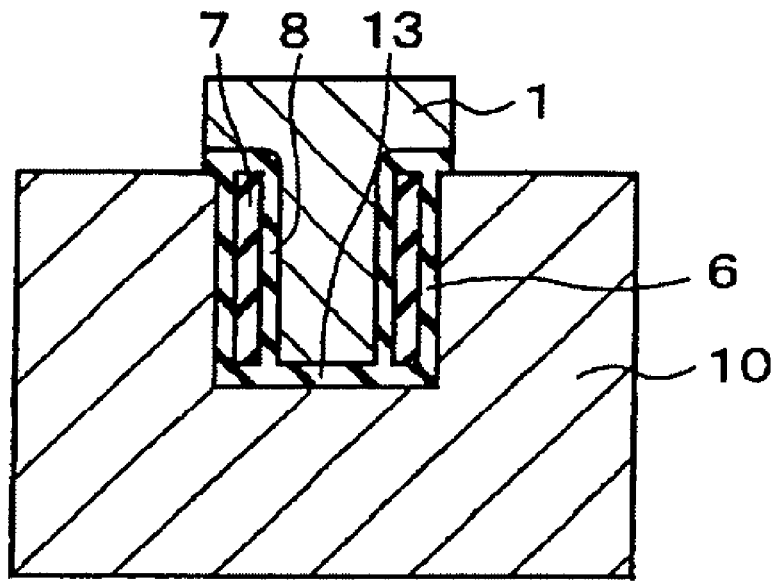

Then, as shown in FIG. 10G, the hard mask 16 was selectively removed, and the exposed second gate insulating film 8, electric charge accumulating film 7, and the first gate insulating film 6 were sequentially removed by wet etching. Note that, the order of removal may be different from the above description. Furthermore, as shown in FIG. 10H, an impurity of the second conduction type was implanted, thereby forming impurity diffusion layers serving as the source/drain regions 5.

Figure 10H:
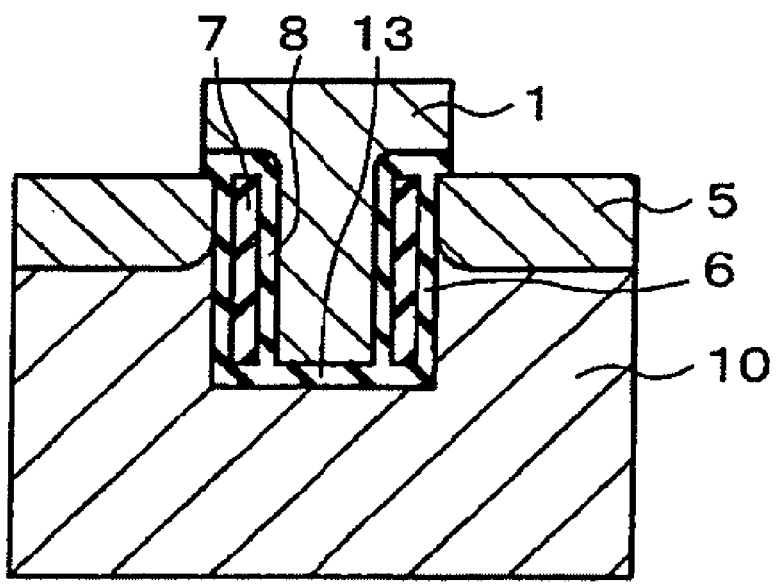

Note that, after the step of FIG. 10H, in order to reduce the resistance value of each part, the surfaces of the source/drain regions and an upper portion of the gate electrode are desired to be caused to be silicide after formation of the gate sidewalls.

When the present manufacturing method is used, the recessed portion, the gate electrode 1, and the electric charge accumulating layers are formed to be self-aligned; therefore, a memory device excellent in the rewriting endurance, retention characteristic, and reading current can be generated with low variation.

Fourth Embodiment

Figure 11:
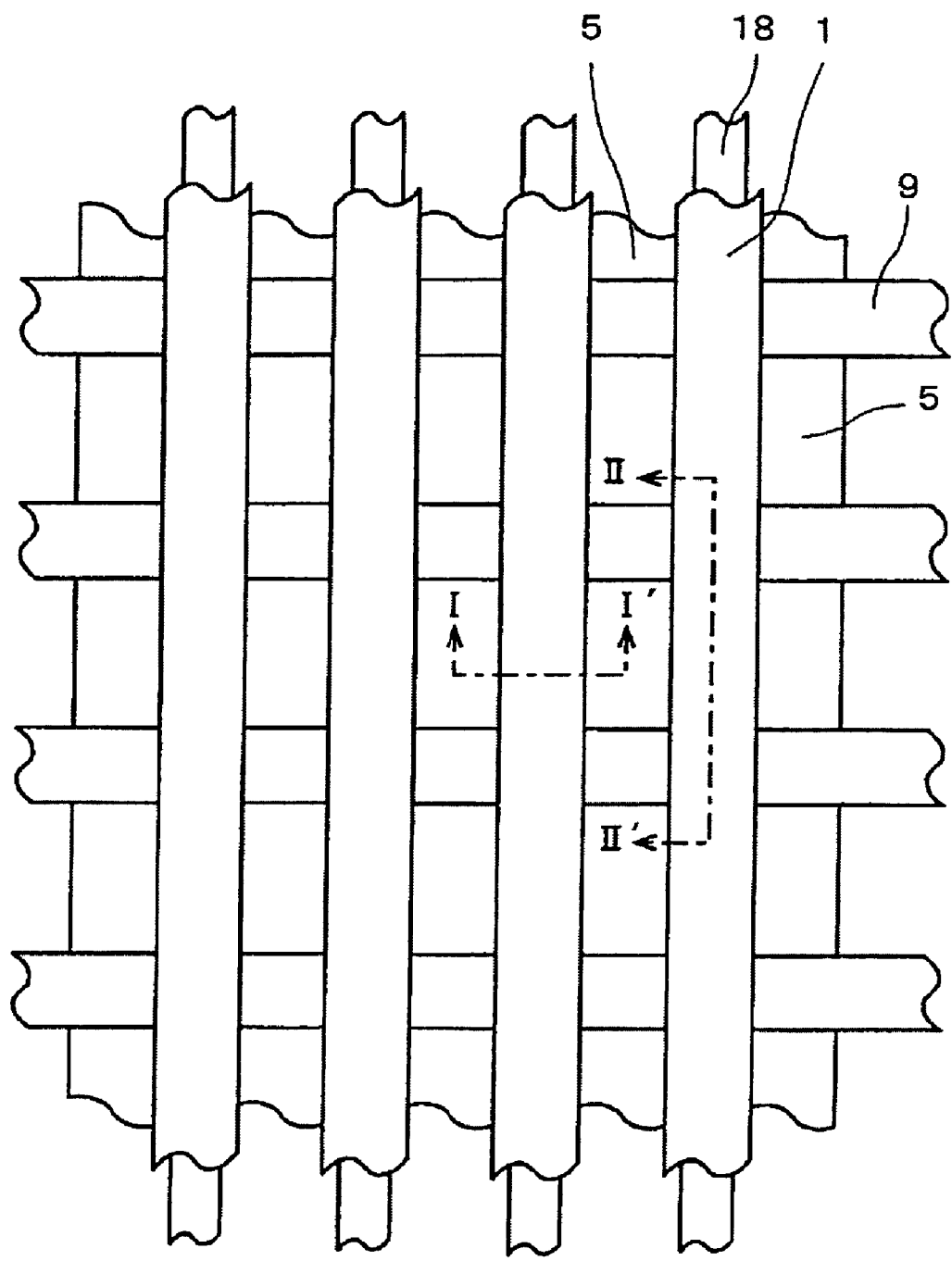
FIG. 11 is a plan view of a fourth example of the present invention.

FIG. 11 shows a plan view of a trap type memory of a fourth example. As shown in FIG. 11, the isolation regions 9 are disposed in predetermined regions of a semiconductor substrate and restrict active regions including the source/drain regions 5. A plurality of projecting portions 18 are formed so as to be sandwiched by the source/drain regions 5 and orthogonal to the isolation regions 9. In addition, the gate electrodes 1 are formed so as to cover the projecting portions 18 and part of the source/drain regions 5 and be parallel to the projecting portions 18.

Figure 12A:
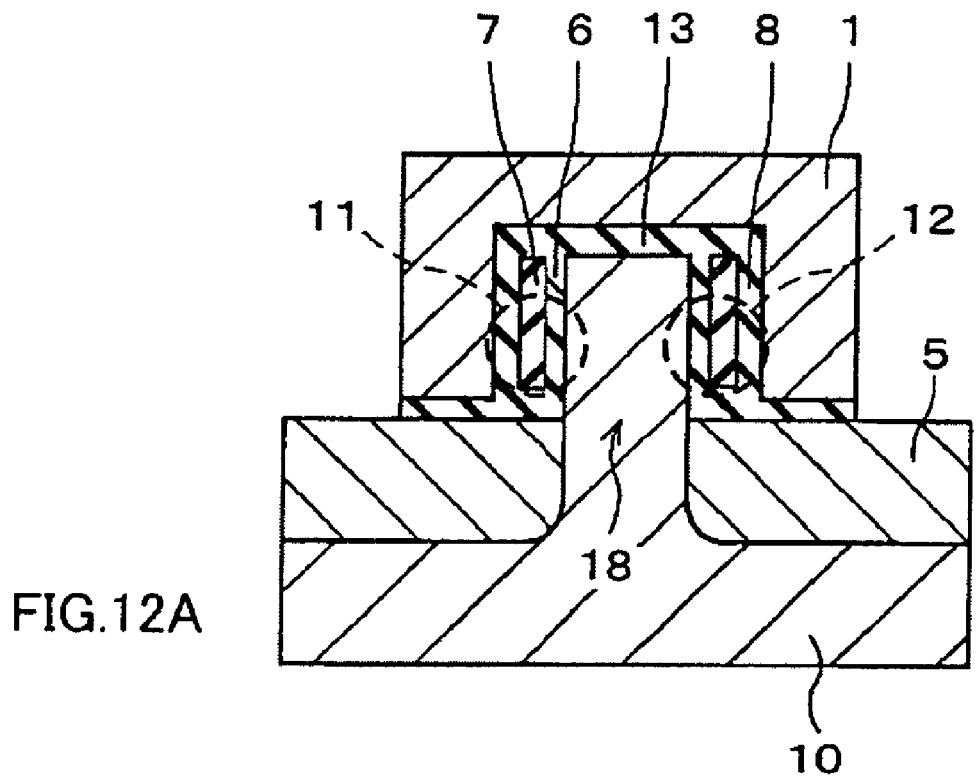
FIG. 12A is a cross sectional view taken along the line I-I' shown in FIG. 11.
Figure 12B:
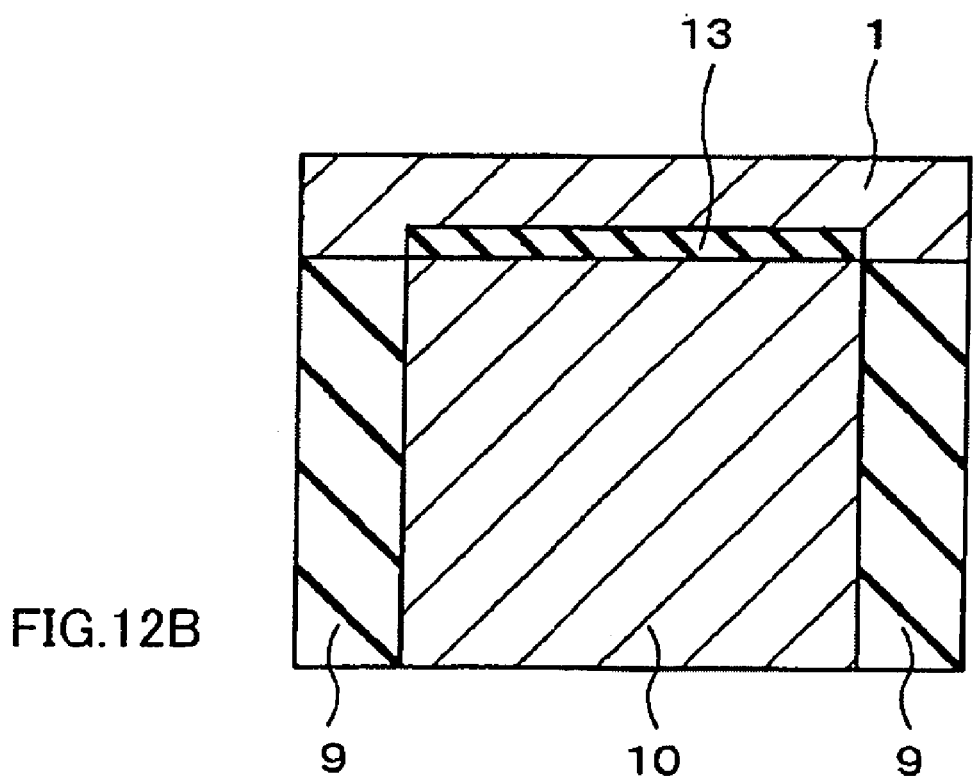
FIG. 12B is a cross sectional view taken along the line II-II' shown in FIG. 11.

FIG. 12A is a cross sectional view taken along the line I-I' shown in FIG. 11, and FIG. 12B is a cross sectional view taken along the line II-II' shown in FIG. 11. As shown in FIGS. 12A and 12B, in the cross section along the line I-I', diffusion layers of the second conduction type which serve as the source/drain regions 5 are formed on the silicon substrate 10 of the first conduction type. In addition, the projecting portion 18 is formed so as to be sandwiched by the source/drain regions 5, and the gate electrode 1 is formed so as to cover the entirety of the projecting portion and part of the source/drain regions 5. The first gate insulating film 6, the electric charge accumulating film 7, and the second gate insulating film 8 are successively formed only in the sidewalls of the projecting portion between the projecting portion and the gate electrode 1, and the two electric charge trap layers thereof function as memory nodes 11 and 12, respectively. The third gate insulating film 13 is formed on the upper surface and part of the bottom portion of the projecting portion. The case in which the first gate insulating films 6 on the symmetrical left and right planes are not in contact with the source/drain regions 5 is shown; however, they may be in contact with each other.

Hereinafter, a manufacturing method of the trap type memory of the fourth example will be briefly explained. FIGS. 13A to 13G are cross sectional views in the order of steps showing the manufacturing method of the fourth example of the present invention and show cross sections along the line I-I' of FIG. 11.

Figure 13A:
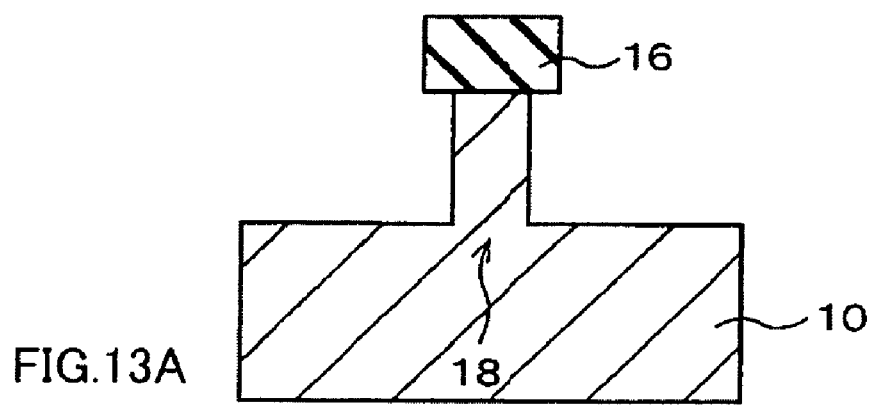
FIGS. 13A to 13G are cross sectional views in the order of steps showing a manufacturing method of the fourth example of the present invention.

First, as shown in FIG. 13A, the patterned hard mask 16 is formed on the silicon substrate 10 using the (100) plane of the first conduction type as a principal surface, and the silicon substrate 10 is dry-etched by using the hard mask 16 as a mask, thereby forming the projecting portion 18 exposing the (010) plane on the side surface thereof. A silicon nitride film formed by using the CVD method was used herein as the hard mask material. When the source/drain regions are to be formed in a next step, it is desired that an end portion of the hard mask 16 is caused to project like an eave from the projecting portion 18 by carrying out etching in which isotropic dry etching or wet etching is carried out after anisotropic dry etching is carried out. Alternatively, instead of the etching method of the two stages, the end portion of the hard mask 16 may be caused to project from the projecting portion 18 at the same time when the projecting portion 18 is formed by etching not having high anisotropy. When it is processed like this, side surfaces of the projecting portion can be prevented from being contaminated by impurities in a next ion implantation step.

Figure 13B:
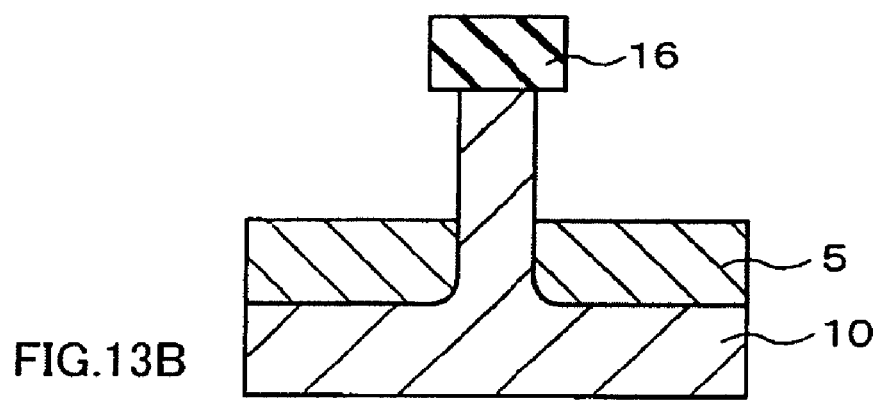

Next, as shown in FIG. 13B, an impurity of the second conduction type is subjected to ion implantation by using the hard mask 16 as a mask, thereby forming impurity diffusion layer regions which serve as the source/drain regions 5 so as to sandwich the projecting portion. This step may be carried out after formation of the gate electrode; however, when it is carried out in this step, the source and drain can be formed to be self-aligned with respect to the projecting portion.

Figure 13C:
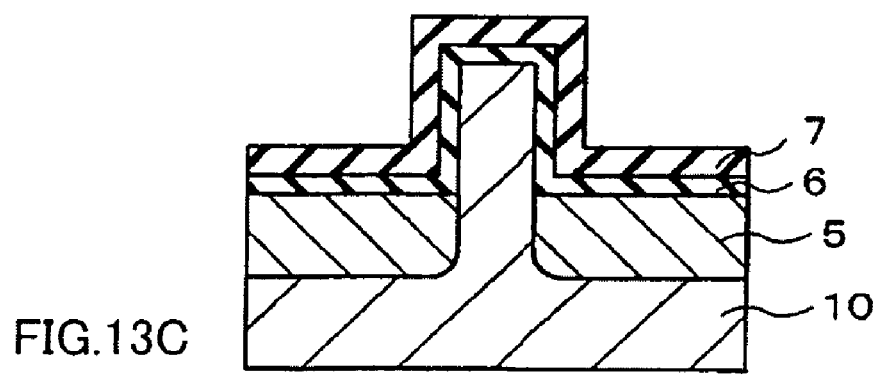

After wafer cleaning, as shown in FIG. 13C, the entire surface of the substrate is oxidized, thereby forming the first gate insulating film 6, and a silicon nitride film which serves as the electric charge accumulating layer 7 is deposited thereon by using the CVD method. Note that, in the oxidation, radical oxidation or the like having small surface orientation dependency of the oxidation rate is desirably used. Herein, the ISSG method is used in the oxidation.

Figure 13D:
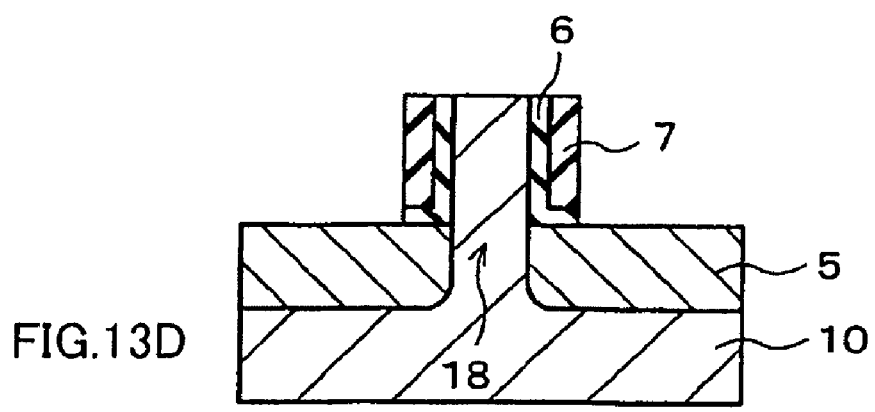

Next, as shown in FIG. 13D, nitride film dry etching and oxide film dry etching was successively carried out, thereby removing the electric charge accumulating layer 7 and the first gate insulating film 6 on the upper surface and bottom portion of the projecting portion by etching.

Figure 13E:
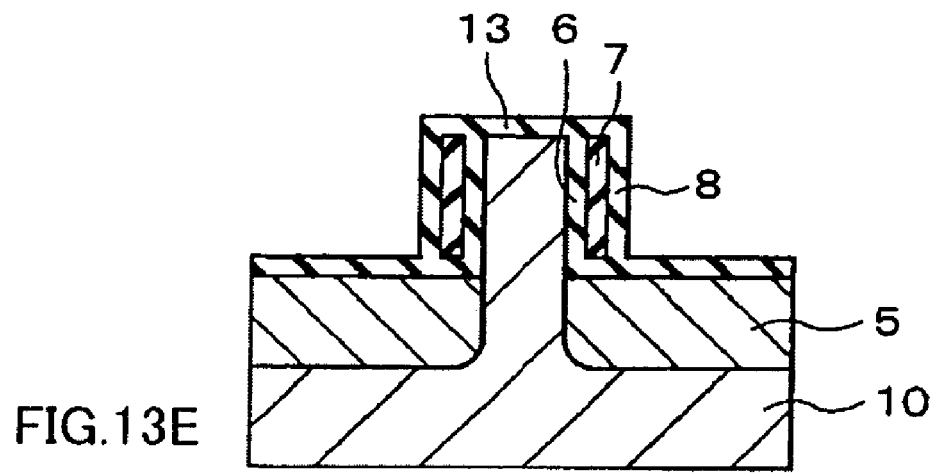

Next, as shown in FIG. 13E, the electric charge accumulating layer 7 (silicon nitride film) and the upper surface and bottom portion of the projecting portion were oxidized, thereby forming the second gate insulating film 8 and the third gate insulating film 13. Also in the oxidation herein, radical oxidation or the like having small surface orientation dependency of the oxidation rate is desirably used. Herein, the ISSG method is used in the oxidation.

Figure 13F:
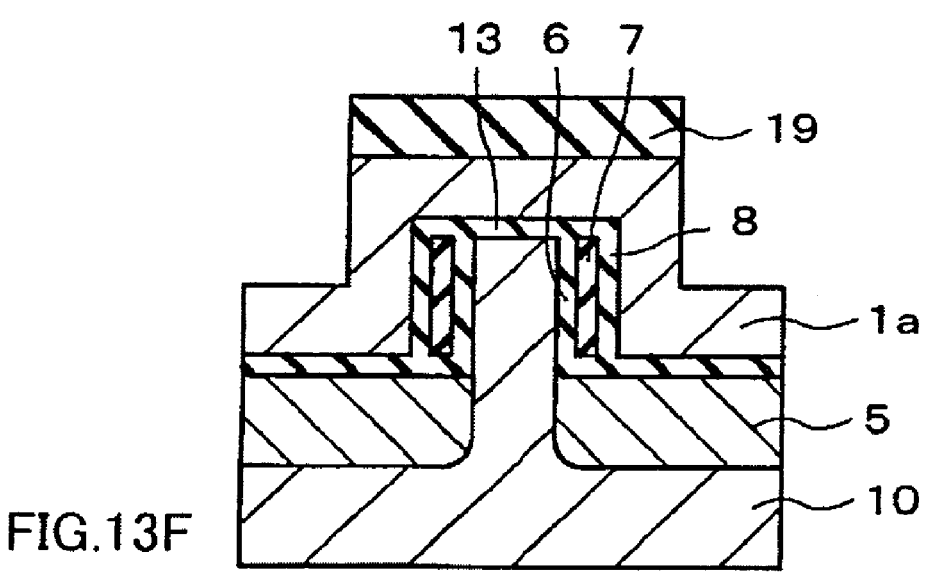
Figure 13G:
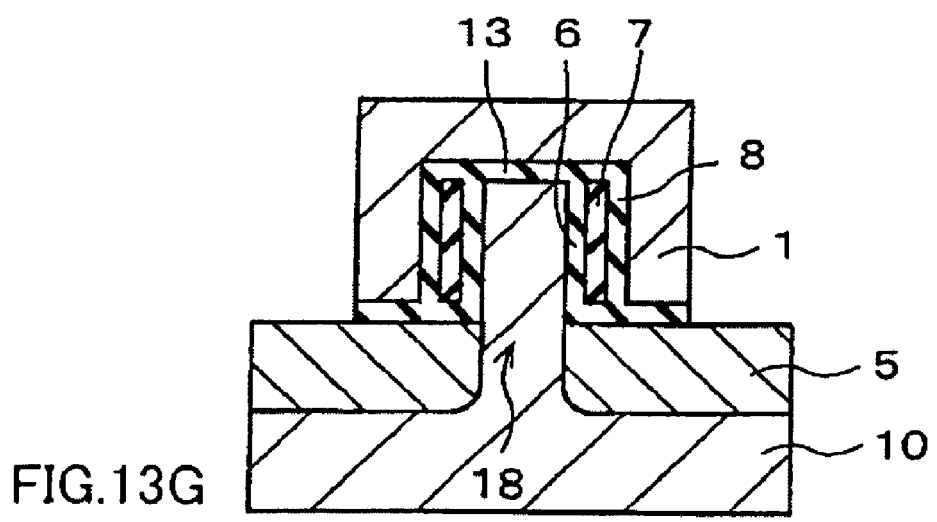
Figure 14:
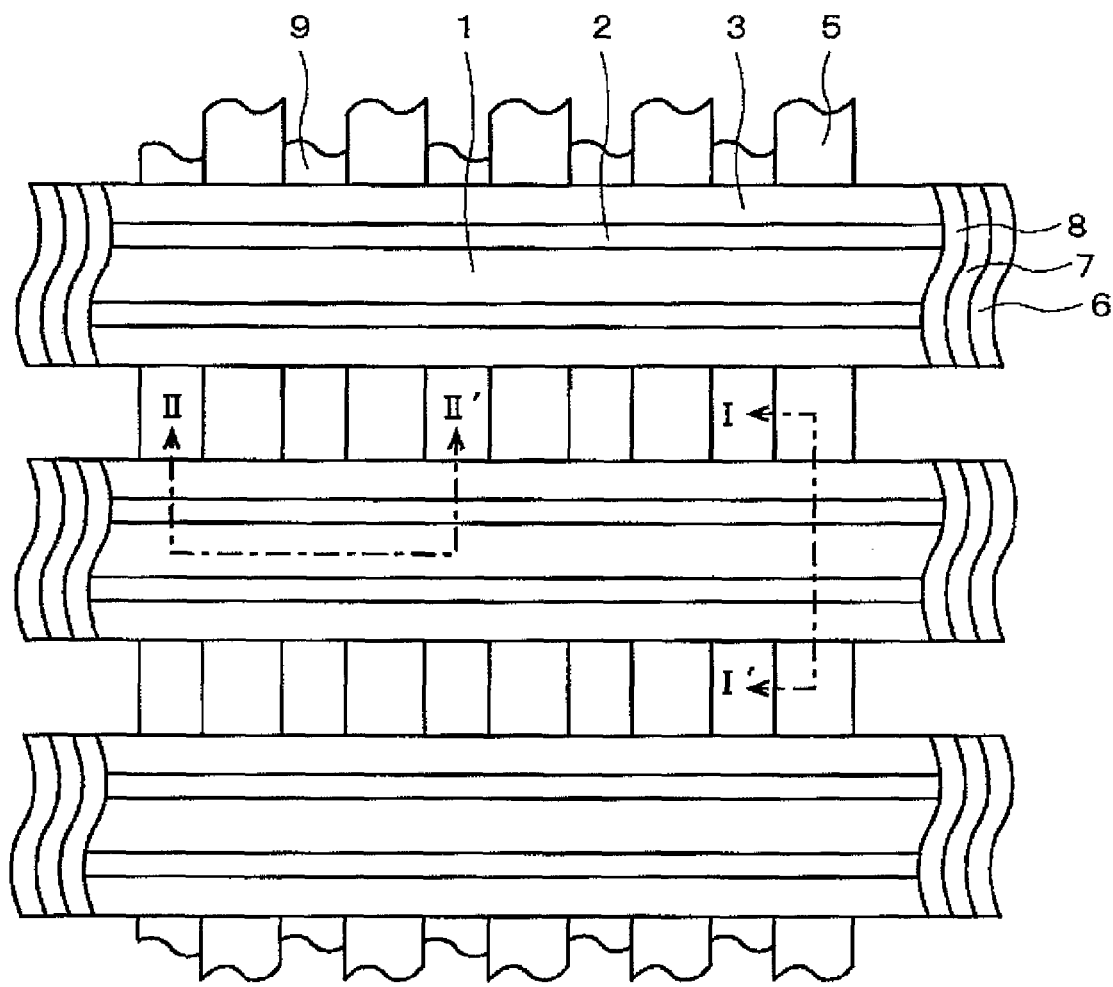
FIG. 14 is a plan view for explaining a related non-volatile memory element.
Figure 15A:
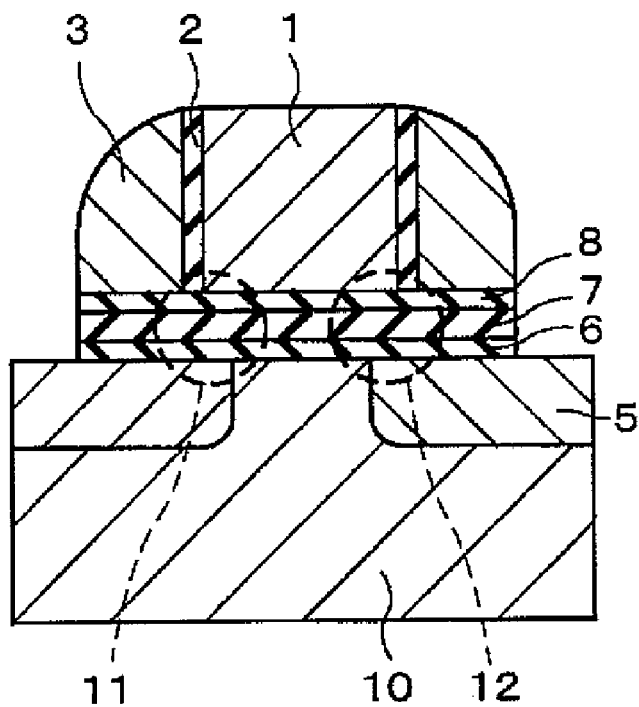
FIG. 15A is a cross sectional view taken along the line I-I' shown in FIG. 14.
Figure 15B:
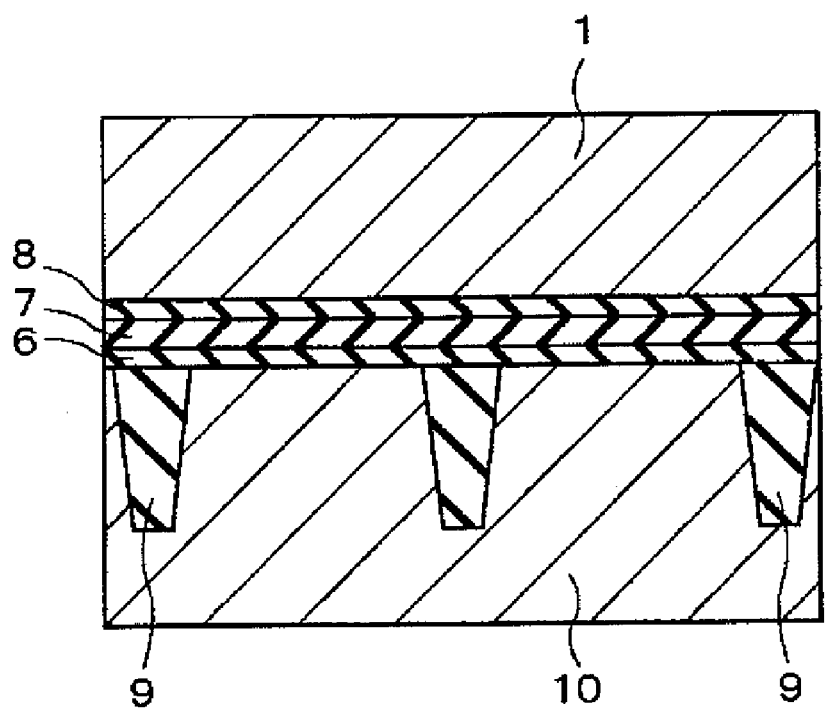
FIG. 15B is a cross sectional view taken along the line II-II' shown in FIG. 14.
Figure 16:
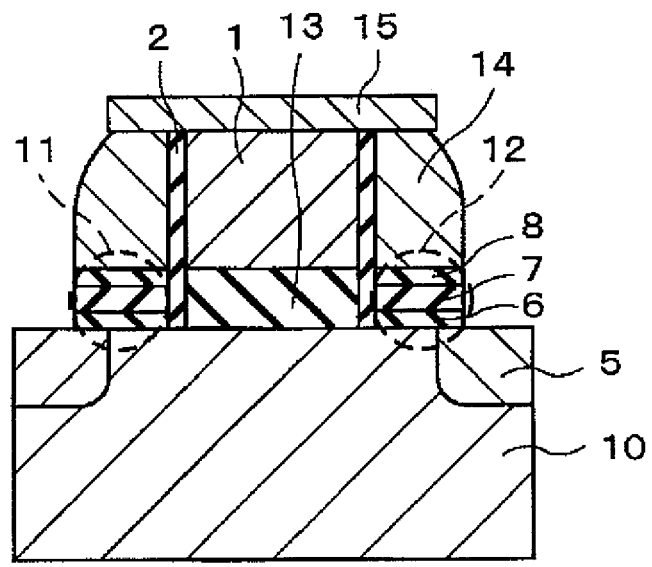
FIG. 16 is a cross sectional view for explaining a non-volatile memory of Non-Patent Literature 1.
Figure 17:
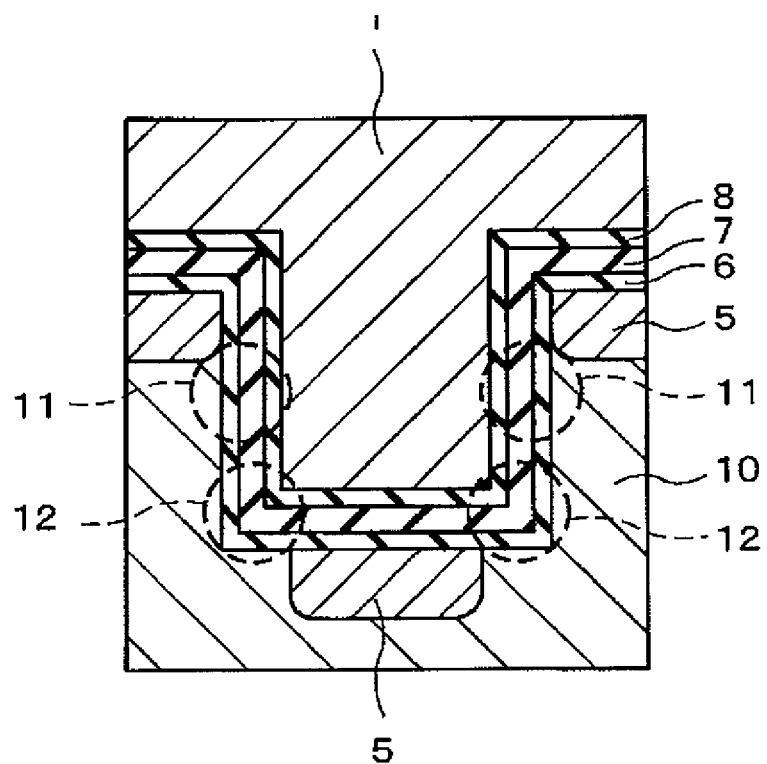
FIG. 17 is a cross sectional view for explaining a non-volatile memory of Patent Literature 1.

Next, as shown in FIG. 13F, a phosphorous-added silicon film 1a was deposited on the entire surface of the wafer by using the CVD method, and a resist mask 19 was formed by carrying out resist application and exposure/development. The resist mask 19 was patterned so as to completely cover the projecting portion 18. Subsequently, as shown in FIG. 13G, the phosphorous-added silicon film 1a was patterned by using dry etching so as to form the gate electrode 1, and the resist mask 19 was exfoliated and removed.

When the present manufacturing method is used, although the gate electrode and the projecting portion are formed through alignment, the projecting portion, the electric charge accumulating layer, and the source/drain regions 5 are formed to be self-aligned. Therefore, a memory device excellent in the rewriting endurance, the retention characteristic, and the reading current can be generated with low variation.

INDUSTRIAL APPLICABILITY

The present invention can be suitably used for, for example, a semiconductor device used in a rewritable nonvolatile memory.

The invention claimed is:

1. A semiconductor device comprising:
    a base substrate comprising a semiconductor layer at least by a surface of the base substrate;
    a channel region formed in the semiconductor layer;
    first and second diffusion layers formed in the semiconductor layer so as to sandwich the channel region;
    an insulating film formed on the base substrate so as to cover the channel region; and
    a gate electrode formed on the base substrate via the insulating film;
    wherein the insulating film contains a structure in which a first insulating region containing an electric charge trap, a second insulating region containing no electric charge trap, and a third insulating region containing an electric charge trap are disposed in this order in a direction from the first diffusion layer to the second diffusion layer along the channel region of the semiconductor layer;
    wherein the channel region between the first and second diffusion layers has first to third planes in the order from the first diffusion layer side;
    wherein a boundary of the first plane and the second plane and a boundary of the second plane and the third plane are formed so as to be practically perpendicular to the direction from the first diffusion layer to the second diffusion layer;
    wherein the first insulating region containing the electric charge trap is disposed on the first plane;
    wherein the second insulating region containing no electric charge trap is disposed on the second plane; and wherein the third insulating region containing the electric charge trap is disposed on the third plane.

2. The semiconductor device according to claim 1, wherein the second plane and the first plane are orthogonal to each other.

3. The semiconductor device according to claim 1, wherein the semiconductor layer is formed by silicon.

4. The semiconductor device according to claim 1, wherein the insulating film is formed on the base substrate so as to further cover part of the first diffusion layer and part of the second diffusion layer.

5. The semiconductor device according to claim 1, wherein each of the first and third insulating regions has first to third layers or first and second layers from the channel region side; each of the first and third layers contains a layer of silicon oxide or silicon oxynitride; and the second layer is a layer comprising one material selected from a group consisting of silicon nitride, silicon oxynitride, alumina, hafnium silicate, hafnium oxide, and aluminium silicate.

6. The semiconductor device according to claim 1, wherein the second plane is practically parallel to a principal surface of the base substrate, and the first plane and the third plane are not practically parallel to the principal surface of the base substrate.

7. The semiconductor device according to claim 1, wherein the first to third planes are crystal planes of the semiconductor layer practically represented by Miller indices (hkl).

8. The semiconductor device according to claim 1, wherein the first plane is practically a (311) crystal plane, a plane crystallographically equivalent to the (311) crystal plane, a crystal plane (100), or a plane crystallographically equivalent to the (100) crystal plane of the semiconductor layer.

9. The semiconductor device according to claim 1, wherein the second plane is practically a (100) crystal plane, a plane crystallographically equivalent to the (100) crystal plane, a crystal plane (110), or a plane crystallographically equivalent to the (110) crystal plane of the semiconductor layer.

10. The semiconductor device according to claim 1, wherein a combination of the first and second planes is practically one combination of crystal planes of the semiconductor layer selected from a group consisting of [(311),(001)], [(100),(011)], and [(311),(011)], and the third plane is practically the same crystal plane as the first plane.

11. The semiconductor device according to claim 1, wherein the first to third planes configure a recessed portion formed on the surface of the base substrate.

12. The semiconductor device according to claim 1, wherein the first to third planes configure a projecting portion formed on the surface of the base substrate.

13. The semiconductor device according to claim 2, wherein a combination of the first and second planes is practically a combination of crystal planes of the semiconductor layer [(100),(010)], and the third plane is practically the same crystal plane as the first plane.

14. A semiconductor device comprising:
a base substrate comprising a semiconductor layer at least by a surface of the base substrate;
a plurality of channel regions formed in the semiconductor layer;
a plurality of sets of first and second diffusion layers formed in the semiconductor layer so that each set sandwiches the channel region;
a plurality of insulating films formed on the base substrate so as to cover the channel regions, each of the insulating films being extended in a first direction, and the insulating films being juxtaposed in a second direction orthogonal to the first direction; and
a plurality of gate electrodes formed on the base substrate via the insulating films, each of the gate electrodes being extended in the first direction, and the gate electrodes being juxtaposed in the second direction;
wherein each of the insulating films contains a structure in which a first insulating region containing an electric charge trap, a second insulating region containing no electric charge trap, and a third insulating region containing an electric charge trap are disposed in this order in a direction from the first diffusion layer to the second diffusion layer along the channel region of the semiconductor layer,
wherein each of the channel regions between the first and second diffusion layers of each of the plurality of sets has first to third planes in the order from the first diffusion layer side;
wherein a boundary of the first plane and the second plane and a boundary of the second plane and the third plane are formed so as to be practically perpendicular to the direction from the first diffusion layer to the second diffusion layer;
wherein the first insulating region containing the electric charge trap is disposed on the first plane;
wherein the second insulating region containing no electric charge trap is disposed on the second plane; and
wherein the third insulating region containing the electric charge trap is disposed on the third plane.

15. The semiconductor device according to claim 14, wherein the second plane and the first plane are orthogonal to each other.

* * * * *

UNITED STATES PATENT AND TRADEMARK OFFICE
CERTIFICATE OF CORRECTION

PATENT NO. : 8,148,757 B2
APPLICATION NO. : 12/447113
DATED : April 3, 2012
INVENTOR(S) : Masayuki Terai, Shinji Fujieda and Akio Toda It is certified that error appears in the above-identified patent and that said Letters Patent is hereby corrected as shown below:

Column 1, Line 33: After "line" insert -- II-II' --

Column 4, Line 35: Delete "II-IF" and insert -- II-II' --

Column 4, Line 43: After "line" insert -- II-II' --

Column 10, Line 11: After "line" insert -- I-I' --

Signed and Sealed this
Twenty-sixth Day of March, 2013

Teresa Stanek Rea
*Acting Director of the United States Patent and Trademark Office*